United States Patent
Dong et al.

(10) Patent No.: US 9,856,722 B2
(45) Date of Patent: Jan. 2, 2018

(54) METHODS AND SYSTEMS FOR CONTROLLING VOLTAGE SWITCHING

(71) Applicant: General Electric Company, Schenectady, NY (US)

(72) Inventors: Dong Dong, Niskayuna, NY (US); Antonio Caiafa, Niskayuna, NY (US); Mohammed Agamy, Niskayuna, NY (US); Ahmed Elasser, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 240 days.

(21) Appl. No.: 14/808,713

(22) Filed: Jul. 24, 2015

(65) Prior Publication Data

US 2015/0330195 A1 Nov. 19, 2015

Related U.S. Application Data

(63) Continuation-in-part of application No. 14/211,894, filed on Mar. 14, 2014.

(51) Int. Cl.
*E21B 43/12* (2006.01)
*H03K 17/10* (2006.01)
(Continued)

(52) U.S. Cl.
CPC ........ *E21B 43/128* (2013.01); *E21B 41/0085* (2013.01); *H02M 1/08* (2013.01);
(Continued)

(58) Field of Classification Search
CPC . E21B 43/128; E21B 41/0085; H03K 17/102; H03K 17/691; H03K 17/6874;
(Continued)

(56) References Cited

U.S. PATENT DOCUMENTS 7,777,370 B2  8/2010  Kojori et al.
7,928,605 B2  4/2011  Williams
(Continued)

FOREIGN PATENT DOCUMENTS

WO     9013178 A1    11/1990

OTHER PUBLICATIONS

Wang, et al.; "High temperature gate drive circuits for silicon carbide switching devices", Energy Conversion Congress and Exposition (ECCE), 2013, IEEE; Sep. 15-19, 2013; pp. 4258-4262; Conference Location: Denver, CO.

(Continued)

*Primary Examiner* — Rafael Pacheco
(74) *Attorney, Agent, or Firm* — Pabitra K. Chakrabarti

(57) ABSTRACT

Power systems and methods are disclosed herein. The systems and methods use a switching system coupled with a power source and subterranean pumps for pumping a resource from beneath a surface of earth. A first capacitor is between a first switching device and a first transformer, and stores electric energy received from the first transformer to activate the first switching device. A bias capacitor is between the first capacitor and the first switching device, and receives a bias voltage via a second transformer. The bias capacitor applies the bias voltage to the first switching device to prevent the first switching device from activating unless a combination of the voltage received by the first switching device via the first transformer and the bias voltage is at least as large as the activation voltage of the first switching device.

20 Claims, 21 Drawing Sheets

(51) Int. Cl.
*H03K 17/691* (2006.01)
*H02M 1/08* (2006.01)
*E21B 41/00* (2006.01)
*H05G 1/58* (2006.01)
*H03K 17/687* (2006.01)

(52) U.S. Cl.
CPC ....... *H03K 17/102* (2013.01); *H03K 17/6874* (2013.01); *H03K 17/691* (2013.01); *H05G 1/58* (2013.01); *Y10T 307/406* (2015.04); *Y10T 307/76* (2015.04)

(58) Field of Classification Search
CPC .......... H05G 1/58; H02M 1/08; Y10T 307/76; Y10T 307/406
See application file for complete search history.

(56) References Cited

U.S. PATENT DOCUMENTS

| | | | |
|---|---|---|---|
| 7,965,522 B1 | 6/2011 | Hornberger et al. | |
| 8,325,497 B2 | 12/2012 | Marotta et al. | |
| 8,339,810 B2 | 12/2012 | Ratnaparkhi et al. | |
| 9,013,144 B2 | 4/2015 | Cooley et al. | |
| 2003/0142513 A1* | 7/2003 | Vinciarelli | H02J 1/102 363/17 |
| 2003/0170077 A1* | 9/2003 | Herd | E21B 17/015 405/224.2 |
| 2012/0143521 A1 | 6/2012 | Chen et al. | |
| 2013/0063184 A1 | 3/2013 | Liang et al. | |

OTHER PUBLICATIONS

Tang S.C., et al.; "Coreless printed circuit board (PCB) transformers with multiple secondary windings for complementary gate drive circuits", Power Electronics, IEEE Transactions on, May 1999; vol. 14; Issue: 3; pp. 431-437.

* cited by examiner

METHODS AND SYSTEMS FOR CONTROLLING VOLTAGE SWITCHING

CROSS-REFERENCE TO RELATED APPLICATIONS

This application is a continuation-in-part of U.S. patent application Ser. No. 14/211,894, which was filed on 14 Mar. 2014, and the entire disclosure of which is incorporated herein by reference.

BACKGROUND

Electrical devices (e.g., X-ray tubes for computed tomography (CT) imaging systems) may use active switches to control the switching of the power source or supply for the devices (e.g., power source or supply for the X-ray tubes). For example, active switches are typically controlled by driving circuits using lower voltage signals, which may be implemented without much complexity when the switches are electrically referenced to ground. However, as the switches are electrically referenced to higher and higher voltages, more complex and bulky driving circuits are needed to allow the switches to turn on and off independently of each other. In these systems, particularly when the switches are referenced to different higher voltages, the control of the multiple switches includes switching equipment that is more complex and bulky (e.g., a large amount of fiber optics for communicating control signals), adding size, complexity, and cost to the overall system.

Known systems for controlling voltage switching, such as for controlling the voltage switching to an X-ray tube (e.g., fast kV switching for dual X-ray systems), may include isolated gate drives. These drives control the voltage switching to control the energy of the electron beam generated by the X-ray source, such as by controlling the voltage to the electron emission source and target of the X-ray tube. For example, CT imaging systems may comprise energy-discriminating (ED), multi-energy (ME), and/or dual-energy (DECT) imaging systems that may be referred to as an EDCT, MECT, and/or DECT imaging system. The EDCT, MECT, and/or DECT imaging systems are configured to measure energy-sensitive projection data. The energy-sensitive projection data may be acquired using multiple applied X-ray spectra by modifying the operating voltage of the X-ray tube or utilizing X-ray beam filtering techniques (e.g., energy-sensitive X-ray generation techniques), or by energy-sensitive data acquisition by the detector using energy-discriminating, or with photon counting detectors or dual-layered detectors (e.g., energy-sensitive X-ray detection techniques).

For example, with X-ray generation techniques, various system configurations utilize modification of the operating voltage of the X-ray tube including: (1) acquisition of different energy (e.g., low-energy and high-energy) projection data from two sequential scans of the object using different operating voltages of the X-ray tube, (2) acquisition of projection data utilizing rapid or fast switching of the operating voltage of the X-ray tube to acquire low-energy and high-energy information for an alternating subset of projection views, or (3) concurrent acquisition of energy-sensitive information using multiple imaging systems with different operating voltages of the X-ray tube.

The known drive controls for these systems may be referenced to high voltages. However, when referenced to the high voltages, the conventional hardware to control the switching is physically large, thereby adding size, weight, and/or cost to the system. In some systems, the lack of space in the overall system may prevent implementation of these drive controls.

Other electrical devices may be used in harsh conditions and, as a result, have limited options for power supply, drive controls, and cabling. For example, electric submersible pumps (ESPs) can be used in oil wells or the like. The ESPs may need to be controlled to pump oil or other material out of downholes that extend far into the earth. The pumps, drive controls, and the like, can be subjected to harsh conditions, such as temperatures in excess of 200 degrees Celsius and/or pressures in excess of 20,000 pounds per square inch (e.g., 138,000 kilopascals). These conditions can limit the available mechanical switching solutions for controlling when different phases of current are supplied to the pumps to control them.

Additionally, the pumps may be located at significant depths within the wells. In order to control the different phases of current supplied to the pumps, one approach can include running different cables or wires to the pumps to separately deliver and control delivery of different phases of current to the pumps. The lengths of cables or wires needed to deliver the current can be a significant cost to operate the pumps, and in some circumstances can be approximately 40% or more of the total cost to operate the pumps.

BRIEF DESCRIPTION

In one embodiment, a power system includes a switching system configured to be operably coupled with a power source that supplies electric current to plural subterranean pumps for pumping a resource from beneath a surface of earth. The switching system includes switching assemblies configured to control conduction of the current from the power source to the pumps. The switching assemblies include switch cells that comprise a solid state first switching device, a first capacitor, and a bias capacitor. The first switching device is configured to activate and be responsive to receiving a voltage from that is at least as large as an activation voltage of the first switching device to conduct electric current between a first transformer and an electric load. The first switching device is configured to deactivate and to stop conduction of the electric current between the first transformer and the electric load. The first capacitor is conductively coupled with the first switching device and the first transformer between the first switching device and the first transformer. The first capacitor is configured to store electric energy received from the first transformer to activate the first switching device. The bias capacitor is conductively coupled with the first switching device between the first capacitor and the first switching device. The bias capacitor is configured to be conductively coupled with a second transformer to receive a bias voltage via the second transformer. The bias capacitor is configured to apply the bias voltage to the first switching device to prevent the first switching device from activating and conducting the current from the power source to one or more of the pumps unless a combination of the voltage received by the first switching device via the first transformer and the bias voltage is at least as large as the activation voltage of the first switching device.

In another embodiment, a power system includes a switching system configured to be operably coupled with a power source that supplies electric current to plural subterranean pumps for pumping a resource from beneath a surface of earth. The switching system includes switching assemblies configured to control conduction of the current from the power source to the pumps. The switching assemblies include switch cells that comprise a solid state first switching device, a first capacitor, a solid state following switching device, and a first diode. The solid state first switching device is configured to activate and be responsive to receiving a voltage that is at least as large as an activation voltage of the first switching device to conduct electric current between a first transformer and an electric load. The first switching device is configured to deactivate and to stop conduction of the electric current between the first transformer and the electric load. The first capacitor is conductively coupled with the first switching device and the first transformer between the first switching device and the first transformer, the first capacitor configured to store electric energy received from the first transformer to activate the first switching device. The solid state following switching device is conductively coupled with the first switching device and the first capacitor in a location between the first switching device and the first capacitor. The first diode is conductively coupled with the following switching device and the first switching device in a location between the first capacitor and the first switching device. The following switching device and the first diode are configured to conduct electric noise received via the first switching device in a conductive loop that excludes the first capacitor.

In another embodiment, a power system includes a switching system configured to be operably coupled with a power source that supplies electric current to plural subterranean pumps for pumping a resource from beneath a surface of earth. The switching system includes switching assemblies configured to control conduction of the current from the power source to the pumps. The switching assemblies include switch cells that comprise a solid state first switching device, a first capacitor, a bias capacitor, a solid state following switching device, and a first diode. The first switching device is configured to activate and be responsive to receiving a voltage that is at least as large as an activation voltage of the first switching device to conduct electric current between a first transformer and an electric load. The first switching device is configured to deactivate and to stop conduction of the electric current between the first transformer and the electric load. The first capacitor is conductively coupled with the first switching device and the first transformer between the first switching device and the first transformer. The first capacitor is configured to store electric energy received from the first transformer to activate the first switching device. The bias capacitor is conductively coupled with the first switching device between the first capacitor and the first switching device. The bias capacitor is configured to be conductively coupled with a second transformer to receive a bias voltage via the second transformer. The bias capacitor is configured to apply the bias voltage to the first switching device to prevent the first switching device from activating unless a combination of the voltage received by the first switching device via the first transformer and the bias voltage is at least as large as the activation voltage of the first switching device. The following switching device is conductively coupled with the first switching device and the first capacitor in a location between the first switching device and the first capacitor. The first diode is conductively coupled with the following switching device and the first switching device in a location between the first capacitor and the first switching device. The following switching device and the first diode are configured to conduct electric noise received via the first switching device in a conductive loop that excludes the first capacitor.

In accordance with various embodiments, a voltage switching system is provided that includes one or more transformers having a plurality of primary and secondary windings, and a plurality of switching devices, wherein at least two of the switching devices are configured to produce different voltage outputs from a voltage input generated at the transformer. The plurality of switches is electrically referenced to one or more voltages. The voltage switching system also includes a drive arrangement connected to the plurality of switches and configured to receive one or more voltage control pulses through the primary windings of the transformer, wherein the drive arrangement switches one or more of the plurality of switches based on the one or more voltage control pulses.

In accordance with other various embodiments, an X-ray system is provided that includes an X-ray source including an X-ray tube configured to operate at a plurality of different voltages and a plurality of switching devices, wherein at least two of the switching devices are configured to produce different voltage outputs from a voltage input generated at a transformer to control the switching of the X-ray tube at the plurality of different voltages. The X-ray system also includes a drive arrangement connected to the plurality of switches and configured to receive one or more voltage control pulses through the primary windings of the transformer(s), wherein the drive arrangement switches one or more of the plurality of switches based on the one or more voltage control pulses.

In accordance with yet other various embodiments, a method for controlling voltage switching is provided that includes configuring a voltage switching system as described above.

DETAILED DESCRIPTION

Figure 1:
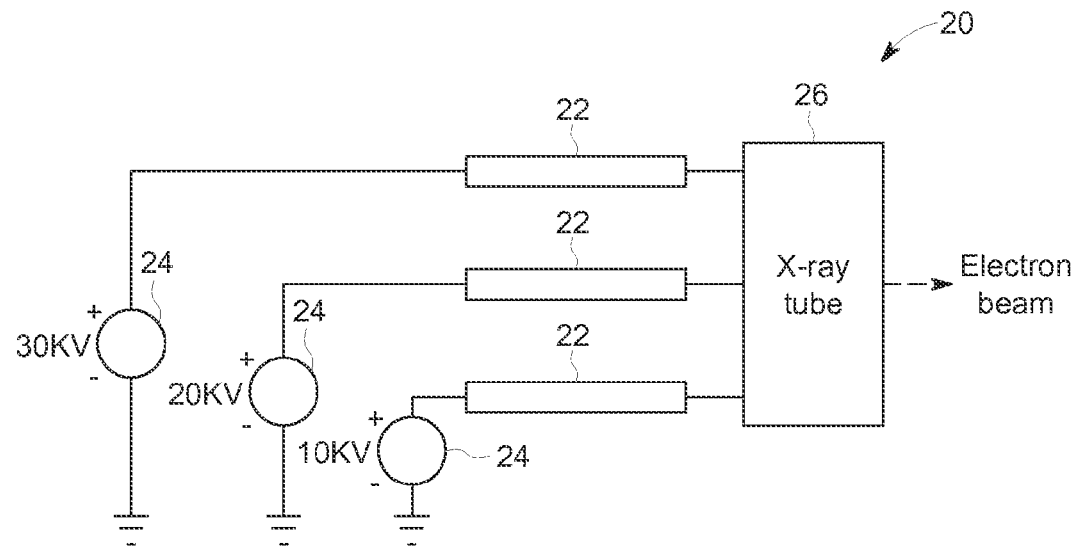
FIG. 1 is a simplified block diagram of a power system in accordance with various embodiments.

The following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Although the various embodiments may be described herein within a particular operating environment, for example a particular imaging system, such as a "third generation" computed tomography (CT) system (e.g., a sixty-four-slice CT system), it should be appreciated that one or more embodiments are equally applicable for use with other configurations and systems, such as for different types of medical and baggage scanning systems. For example, various embodiments are applicable to X-ray radiographic imaging systems as well as X-ray tomosynthesis imaging systems. Additionally, embodiments will be described with respect to the detection and conversion of X-rays. However, it also should be appreciated that embodiments are equally applicable for the detection and conversion of other high frequency electromagnetic energy. Also, although the X-ray tube and detector may be described to rotate around the object being imaged, alternate configurations wherein the detector and X-ray source are held stationary and the object is rotated are also contemplated, such as is used for industrial non-destructive testing purposes. Hence, although discussed in the context of CT systems, the various embodiments may be applied to projection X-ray imaging used in other medical and industrial radiographic applications as well.

Various embodiments provide systems and methods for controlling voltage switching, which may include a gate drive for controlling multiple devices floating at multiple voltages. For example, some embodiments provide control of switches simultaneously or concurrently when the switches are referenced to high voltages (e.g., 10 kV-300 kV), including when referenced to multiple high voltages. By practicing one or more embodiments, control of switches for voltages applied or referenced to multiple devices may be simplified, including having controls with less components and being less complex. For example, various embodiments may be used for super-fast kV switching applications, such as for use in dual X-ray systems. By practicing one or more various embodiments, fast switching between a first voltage level and a second voltage level (e.g., high and low voltage levels) may be achieved, enabling improved separation in the mean energy of applied X-ray spectra, thereby improving material decomposition and effective atomic number estimation of a scanned object.

Figure 2:
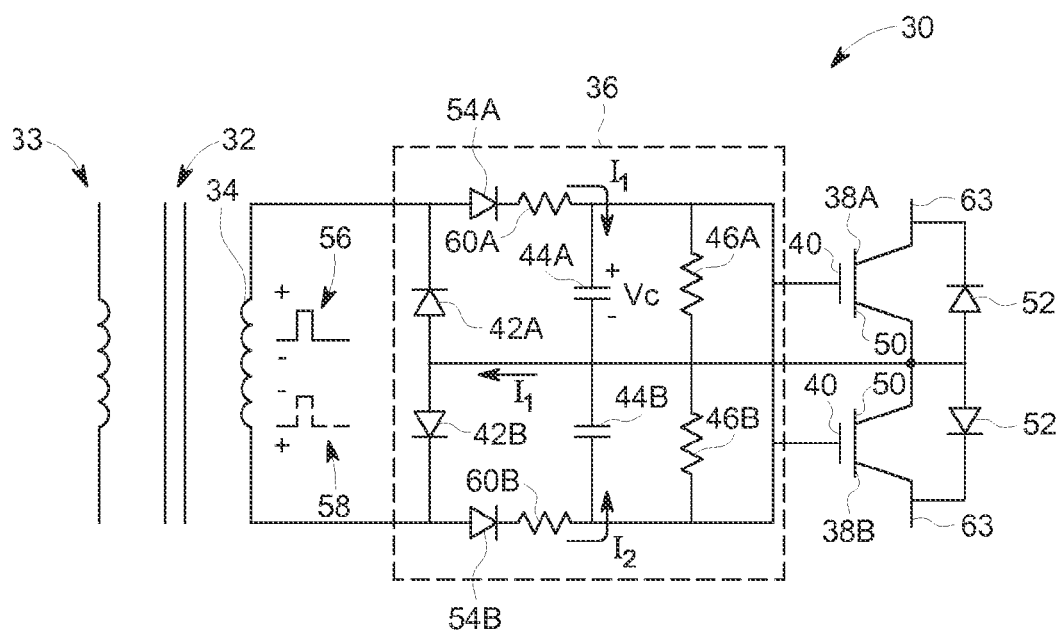
FIG. 2 is schematic diagram of a switching drive arrangement in accordance with one embodiment.
Figure 6:
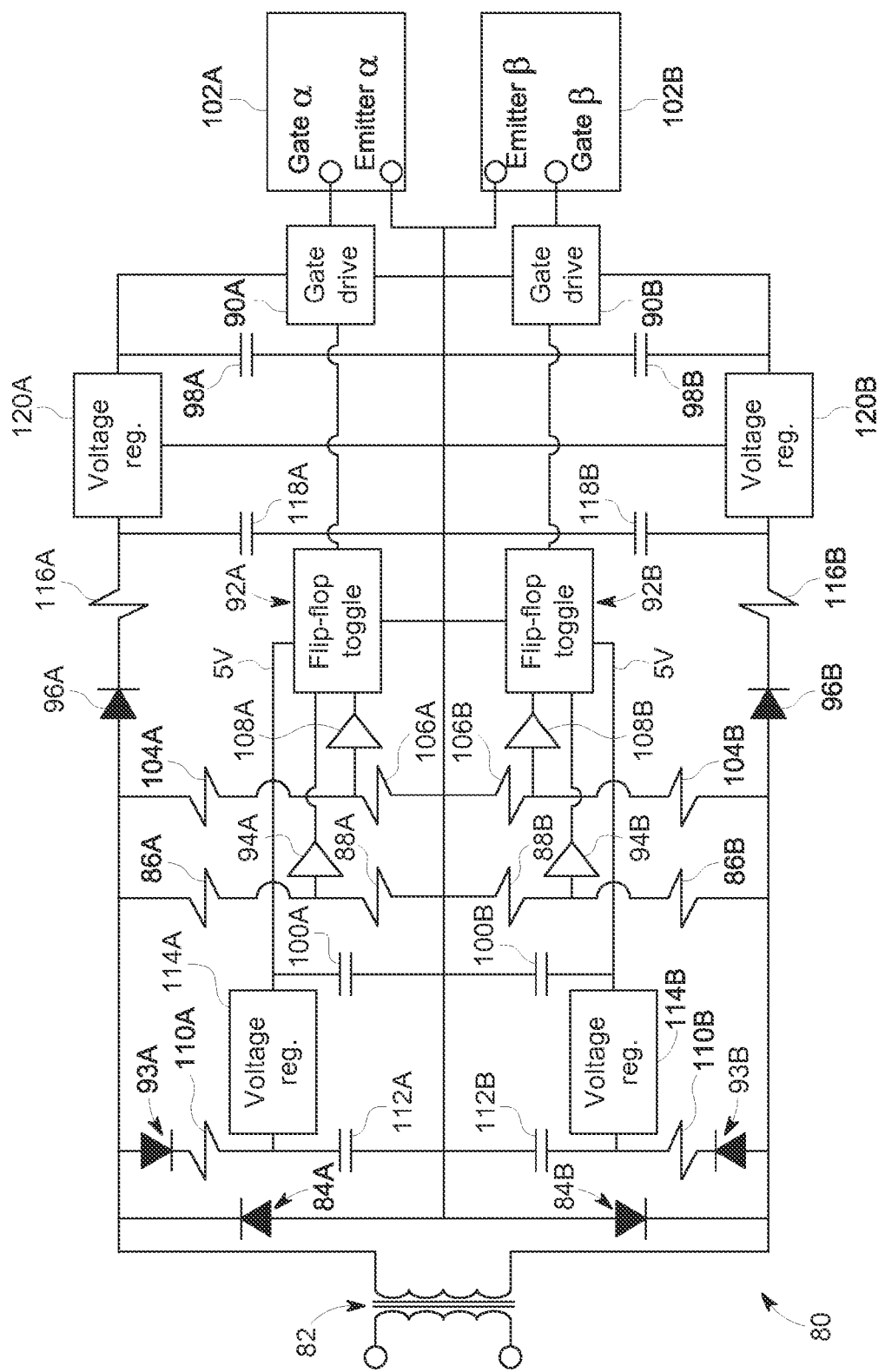
FIG. 6 is schematic diagram of a switching drive arrangement in accordance with another embodiment.

By practicing one or more embodiments, for example as shown in FIG. 2, a plurality of switches (e.g., two switches) may be independently controlled with a single transformer winding. By practicing one or more embodiments, for example as shown in FIG. 6, drive power may be provided, as well as control signals, with a single transformer. Thus, in various embodiments, one or more controls or functions may be performed using a single component, such as a single transformer or transformer winding. Accordingly, a reduced number of transformers or other control devices may be used in various embodiments. Additionally, a reduced cost or size of the transformers may be provided in some embodiments. For example, in high voltage circuits, the cost and size of the transformers is primarily due to the high voltage insulation used, which can be reduced by practicing one or more embodiments.

Various embodiments may be implemented in systems where the voltage to be switched is very large (e.g., 200 kV or greater), the parasitic capacitances to ground are also very large, or the energy required by the load is relatively small, as is the case for industrial inspection systems utilizing stationary anode X-ray tube technology. In various embodiments, power or voltage switching of multiple devices or components referenced to different high voltages is provided. For example, as shown in FIG. 1 illustrating a power system 20, a plurality of devices, illustrated as printed circuit boards (PCBs) 22 are each powered or referenced to multiple voltages, illustrated as a plurality of power sources 24. For example, in the illustrated embodiment, three PCBs 22 are referenced to three different power sources 24, in particular, referenced to multiple high voltages (in this embodiment, 10 kV, 20 kV and 30 kV). It should be noted that in various embodiments, at least two of the referenced voltages are different.

In one embodiment, the PCBs 22 may be power supply or power control boards for controlling the power to an X-ray tube 26 to control the energy of the electron beam, such as in a fast switching architecture. However, it should be noted that various embodiments may be implemented in connection with different types of systems that have different referenced voltage levels. Additionally, the power switching to additional devices or components may be controlled and the three components in FIG. 1 are merely for illustration. For example, in some embodiments, 50, 60, or more components may be controlled.

In various embodiments, different gate drive arrangements may be provided for controlling the switching of the different referenced voltages. For example, passive and/or active switching drive arrangements may be provided. In particular, FIG. 2 illustrates a passive drive arrangement 30 in accordance with various embodiments. The passive drive arrangement 30 optionally may be referred to as a switch cell. In this embodiment, the gate drive is powered by the received signal itself as described in more detail herein.

The passive drive arrangement 30 may be used to control switching of power from a transformer 32 having a primary winding 33 and a secondary winding 34. The passive drive arrangement 30 includes a gate drive circuit 36 that controls the power to a pair of switching devices 38, illustrated as Insulated Gate Bipolar Transistor (IGBT). However, it should be appreciated that different switching devices may be used, for example metal-oxide-semiconductor field-effect transistors (MOSFETs), or different types of transistors. Additionally, it should be noted that the switching devices may be formed using silicon (Si), Silicon Carbide (SiC), Gallium Nitride (GaN) or any other material suitable to build controllable solid state devices. In various embodiments, the gate drive circuit 36 controls the drive signal to the gates 40 of the switching devices 38.

In particular, the gate drive circuit 36 includes a pair of diodes 42 connected, through a pair of diodes 54 in series with a resistor 60, with a pair of capacitors 44, which are connected in parallel with a pair of resistors 46. This parallel connection arrangement is illustrated as connected across the secondary winding 34 of the transformer 32. Each set of components, namely the set of the diode 42a and the diode 54a, resistor 60a, capacitor 44a and resistor 46a and the set of the diode 42b and the diode 54b, capacitor 44b and resistor 46b are connected across the gate 40 and source 50 of each of the switching devices 38. A pair of diodes 52 is also connected between the source 50 and drain 63 of each of the switching devices 38 to complete the power arrangement. It should be noted that in some embodiments, the switching devices 38 may be connected, for example, in a common emitter configuration (as shown in FIG. 2). It also should be noted that the diodes 42 and the diodes 52 in each of these pairs is connected in opposing directions, illustrated as having anodes thereof connected to each other.

The gate drive circuit 36 also includes a pair of diodes 54 connected in series with the resistor 60, and between the diodes 42 and capacitors 44. In particular, the cathode of the diodes 42a and 42b are connected to the anodes of the diodes 54a and 54b, respectively. The resistors 60 operate as a filtering element. It should be noted that in some embodiments the resistors 60 are not provided, in which case the pair of diodes 54 are directly connected between the diodes 42 and the capacitors 44.

In operation, and for example, a positive pulse voltage 56 may be sent from the transformer 32, by means of the primary winding 33, in one direction. However, as described herein different voltage control pulses or signals may be used. With the illustrated pulse voltage 56, a current $I_1$ is generated (through the diodes 54a and 42b, and the resistor 60a if provided) that charges the capacitor 44a to a voltage (Vc), which may be referred to as a charged state, while the current is blocked from charging the capacitor 44b. The charging of the capacitor 44a results in a drive signal at the gate 40 of the switching device 38a, which turns on the switching device 38a when the voltage charge of the capacitor 44a exceeds the threshold voltage of the gate 38a, allowing current flow through the switching device 38a. The switching device 38a may be maintained in an on state by sending a train of pulses to maintain the charge of the capacitor 44a. Once a train of pulses is stopped, the capacitor 44a discharges through the resistor 46a, which may be referred to as a discharged state. As the capacitor 44a discharges, when the voltage charge of the capacitor 44a falls below the threshold voltage of the gate 40, the switching device 38a turns off, blocking current flow through the switching device 38a.

In operation, a negative pulse voltage 58 may be sent from the transformer 32 in one direction. In this case, the switching of the device 38b is controlled. In particular, with the illustrated pulse voltage 58, a current $I_2$ is generated (through the diodes 54b and 42a, and the resistor 60b if provided) that charges the capacitor 44b, while the current is blocked from charging the capacitor 44a. The charging of the capacitor 44b results in a drive signal at the gate 40 of the switching device 38b, which turns on the switching device 38b when the voltage charge of the capacitor 44a exceeds the threshold voltage of the gate 38b, allowing current flow through the switching device 38b. The switching device 38b may be maintained in an on state by sending a train of pulses to maintain the charge of the capacitor 44b. Once a train of pulses is stopped, the capacitor 44b discharges through the resistor 46b. As the capacitor 44b discharges, when the voltage charge of the capacitor 44b falls below the threshold voltage of the gate 40, the switching device 38b turns off, blocking current flow through the switching device 38b.

Figure 3:
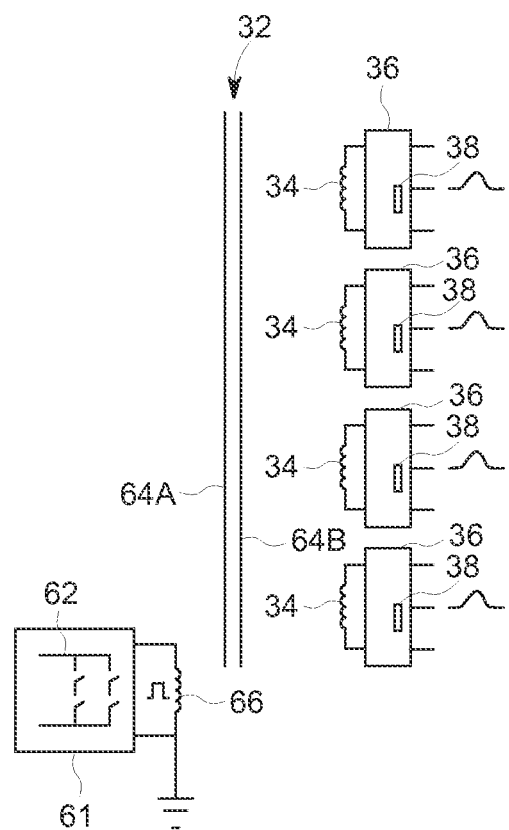
FIG. 3 is a schematic diagram of a switching architecture including the switching drive arrangement of FIG. 2.

As illustrated in FIG. 3, a plurality of gate drive circuits 36 may be provided and connected to a plurality of secondary windings 34 of a transformer 32. The primary winding 66 of the transformer 32 connected to a single power control, illustrated as a voltage tank 61 having switches to control the generation of positive or negative pulse voltages as described above. As can be seen, using multiple secondary windings 34 (also referred to as secondaries) that may be floating at different voltages, a plurality of gate drive circuits 36 may be controlled using a single signal (applied to the primary winding 66) generated from the voltage tank 61. It should be noted that even if the reference voltage changes, it does not have an effect as the secondary windings 34, and therefore the gate drive circuits 36, are isolated. Thus, the switching devices 38 may be turned on and maintained on without any external or additional power.

Figure 4:
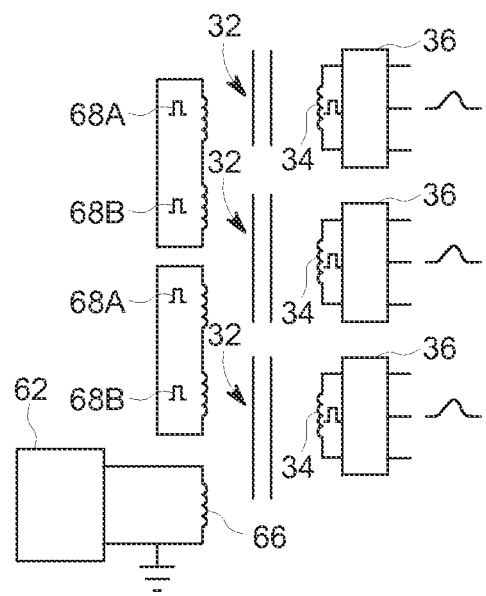
FIG. 4 is a schematic diagram of another switching architecture including the switching drive arrangement of FIG. 2.

Variations and modifications are contemplated. For example, as illustrated in FIG. 4, one transformer 32 may be provided for each gate drive circuit 36, for example, for each PCB 22 (shown in FIG. 1). In this embodiment, the voltage signal is reproduced, with each being sent to a different gate drive circuit 36. It should be noted that in this embodiment, the isolation for each of the gate drive circuits 36 is reduced as a result of use of the multiple transformers 32. Thus, in this embodiment, there is one transformer 32 per PCB board driving multiple gate drive circuits 36.

Figure 5:
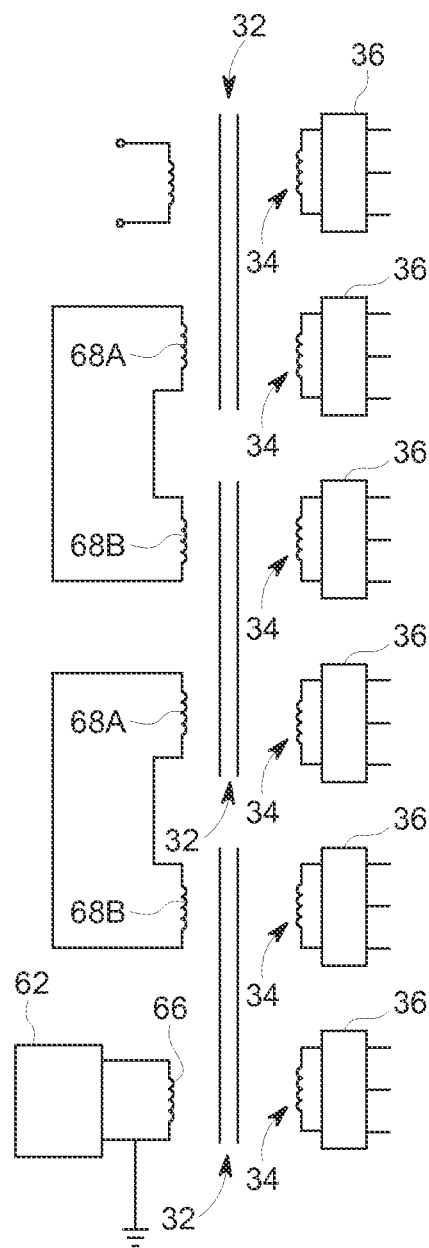
FIG. 5 is a schematic diagram of another switching architecture including the switching drive arrangement of FIG. 2.

However, in other embodiments, there may be multiple secondary windings 34 per transformer 32 such that the plurality of gate signals are generated by a plurality of transformers 32 and a plurality of circuits 36 per transformer, as shown in FIG. 5. For example, each of the transformers 32 has two primaries (primary windings), primary winding 68a (and primary winding 66 for the first transformer illustrated at the bottom of FIG. 5) to receive the signal from the previous transformer (or the circuit 62 for the first transformer) and one primary winding 68b to send the signal to the next transformer 32. Additionally, each of the transformers 32 includes two windings 34 on the secondary side to send the voltage pulses to each of the gate drive circuits 36. It should be noted that the number of secondaries is not limited to two. Additionally, it should be noted that an arrangement with multiple transformers 32 allows for a much smaller size when the X-ray generator produces a very large voltage.

Figure 7:
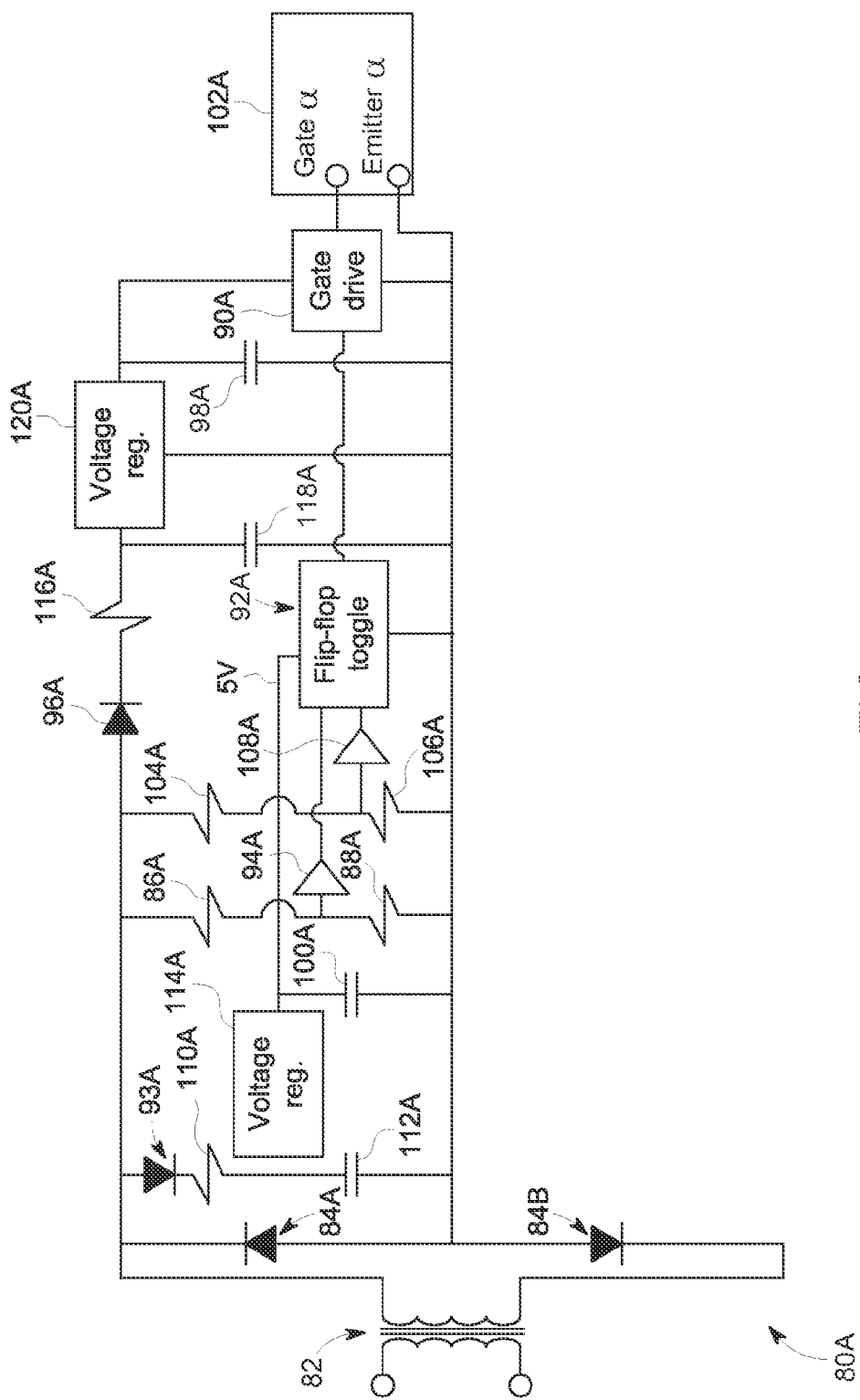
FIG. 7 is schematic diagram of a switching drive arrangement in accordance with another embodiment.
Figure 8:
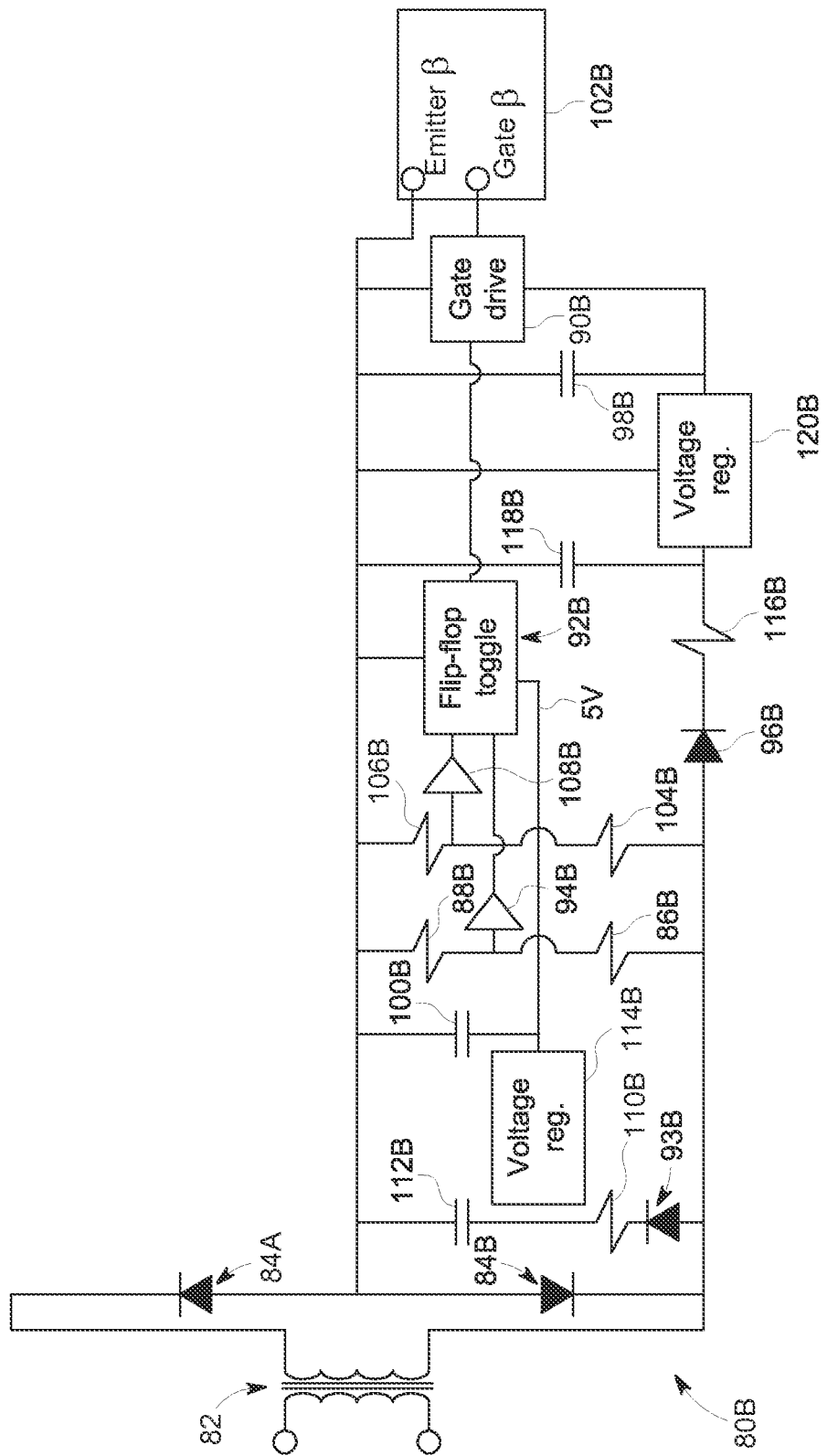
FIG. 8 is schematic diagram of a switching drive arrangement in accordance with another embodiment.

Other embodiments may provide an active drive arrangement 80, for example, as shown in FIGS. 6 through 8. In the embodiment shown in FIG. 6, a pair of gate drive devices 90a and 90b are controlled by signals from a transformer 82 using a pair of flip-flops 92a and 92b operating in a toggle mode. It should be noted that although the active drive arrangement is shown controlling a pair of gate drive devices 90a and 90b, each gate drive device 90a and 90b may be separately controlled by a corresponding transformer 82, such that the top and bottom portions of the circuit shown in FIG. 6 are separated (i.e., not in a common emitter configuration). These alternative arrangements are shown in FIGS. 7 and 8.

The active drive arrangement 80 includes a pair of diodes 84 each connected in parallel with a pair of resistors 86 and 88. It should be noted that each separate elements of the pair is generally designated as "a" and "b", for example, diodes 84a and 84b. The pair of resistors 86 and 88 form a resistive voltage divider with a buffer 94 connected between the resistors 86, 88. The output of the buffer 94 is connected to the clock pin of the flip-flop 92 and the output (illustrated as the q output) of the flip-flop 92 is connected to the gate drive device 90. Similarly, the diodes 84 are each connected in parallel with another pair of resistors 104 and 106. The pair of resistors 104 and 106 forms another resistive divider with another buffer 108 connected between the resistors 104, 106. The output of the buffer 108 is connected to the RESET pin of the flip flop 92. Diodes 93, resistors 110, and capacitors 112 connected in series are also connected in parallel with the diodes 84.

Further, the input of the voltage regulator 114 is connected in parallel with the capacitor 112 and the output is connected in parallel with the capacitor 100 and the 5V reference voltage (although other reference voltages may be used) of the flip-flop 92. Similarly, the series connection of the diode 96, and the resistor 116; and the capacitor 118 are connected in parallel with the diode 84. The input of the 15V voltage regulator 120 (although other voltage inputs may be used) is connected in parallel with the capacitor 118 and the output is connected in parallel with the other capacitor 98 and the 15V reference voltage of the gate drive 90. Additionally the output of the gate drive device 90 and the switching devices 102 are connected in a common emitter configuration.

Figure 9:
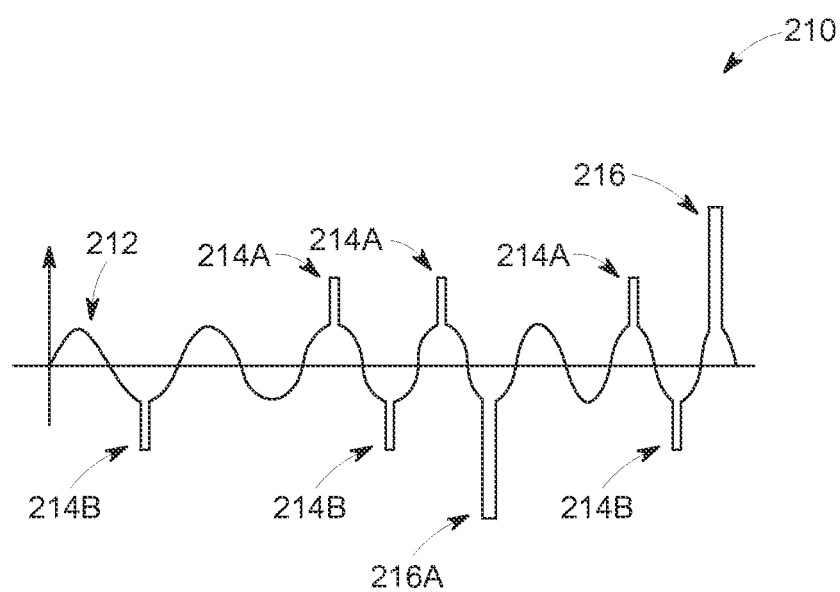
FIG. 9 is a diagram of a voltage waveform in accordance with an embodiment.

In operation, a voltage waveform 210 such as shown in FIG. 9 may be applied to the input terminals of the transformer 82. The voltage waveform 210 in some embodiments is formed by three components. However, it should be appreciated that voltage waveform 210 is merely shown as an example and that different waveforms having different components may be used. One component 212 provides power to the gate drive and the logic component such as the flip-flop 92 and has relatively small amplitude (e.g., 16V). The second component 214 (referred to as pulses) provides the signal for the clock of the flip-flop 92 and has an amplitude larger than the first component (e.g., 20V), and is limited in duration. The third component 216 has the largest amplitude (e.g., 24V) and is used to reset the flip-flop 92 when needed (referred to as large pulses). It should be noted that the positive portion of the waveform 210 provides power and signals to the components connected in parallel with the diode 84a, and the negative portion provides power and signals to the components connected in parallel with the diode 84b. For example, the polarity of the voltage signal may be used to control the switching on and off of the switching devices 102 using the flip-flops 92 as described in more detail below. However, in this embodiment, the switching device 102a or 102b may be maintained on or off by sending different numbers or types of pulses as part of a waveform 210. It should be noted that in FIG. 9, the positive components labeled with an "a" (such as 214a and 216a) control the "a" portion of FIG. 6 (upper portion) and FIG. 7, and the negative components labeled with a "b" (such as 241b and 214b) control the "b" of portion FIG. 6 (bottom portion) and FIG. 8.

As can be seen, the waveform 210 defines a pulse train having lower amplitude components 212, medium amplitude components (pulses) 214, namely pulses having a higher amplitude than components 212, and larger amplitude pulses 216, namely having higher amplitude than the pulses 214. In the illustrated embodiment, the waveform 210 defines signals that are used to send the power for powering flip flop 92 and the gate drive 90, the pulses 214 are used to switch the flip-flops 92, and the pulses 216 are used to reset the flip flop 92, resulting in control signals being output that cause the switching device 102a or 102b to turn on or off (e.g., because the signal is sent to the clock, In operation, for example, an even or odd number of higher pulses 214, for example, 2 or 1, may be used to turn on and off the switching devices 102). It should be noted that in various embodiments, the even higher amplitude pulse 216 (e.g., higher amplitude than 212 and 214) may be sent, which resets the flip-flops 92 to a known state (at a voltage level to drive the reset (r) input of the flip-flop 92). Thus, for example, with a JK flip-flop operating in a toggle mode, the switching devices 102 may be turned on and off by the number of pulses sent through the primary of the transformer 82. Also, if the signal frequency is too low, the capacitors 100 may be recharged by a pulse smaller in amplitude, namely the pulses 212, without triggering the signal circuitry. It should be noted that the power can be sent with the signal.

In the illustrated embodiment, the power (e.g., +5V) is sent through the transformer 82, rectified and filtered by the diode 93, the resistor 110 and the capacitor 112, then regulated to 5V constant by the voltage regulator 114 and the capacitance of the capacitor 100. Similarly, the power for the gate drive (e.g. 15V) is sent through the transformer 82, rectified and filtered by the diode 96, the resistor 116, and the capacitor 118, then regulated to 15V constant by the voltage regulator 120 and the capacitance 98. It should be noted that the complementary q output of the flip-flops 92 may be used to control an additional switch that is referenced to the same voltage level of the main switches (switching devices 102), but is complementary thereto.

Moreover, in this embodiment, the controlling signals are also sent through the transformer 82. The voltage regulators 114 and 120 will not be affected by the controlling pulses 214 or 216 because of the pulses short duration and the filtering action of the resistor 110 and capacitor 112, and the resistor 116 and the capacitor 118 respectively. The resistive divider formed by the resistors 86 and 88 is sized such that the pulse appearing at the input of the buffer 94 is large enough to be changed into "logic 1" only if the magnitude of the pulse 214 exceeds a certain threshold voltage. The resistive divider formed by resistor 104 and resistor 106 is sized such that a pulse 214 that is large enough to be changed into "logic 1" by the buffer 94 is not large enough to be changed into "logic 1" by the buffer 108. Accordingly, only pulses such as 216 will be changed into "logic 1" by the buffer 108 and reset the flip-flop 92. It should be noted that if a pulse is large enough to reset the flip-flop 92, that same pulse creates a clock signal as well, which is not an issue since the reset command overrides all other commands including the signal on the clock. Additionally, it should be noted that the logic inputs to the flip-flop 92 will be protected from over-voltages by voltage limiters (not shown).

Figure 10:
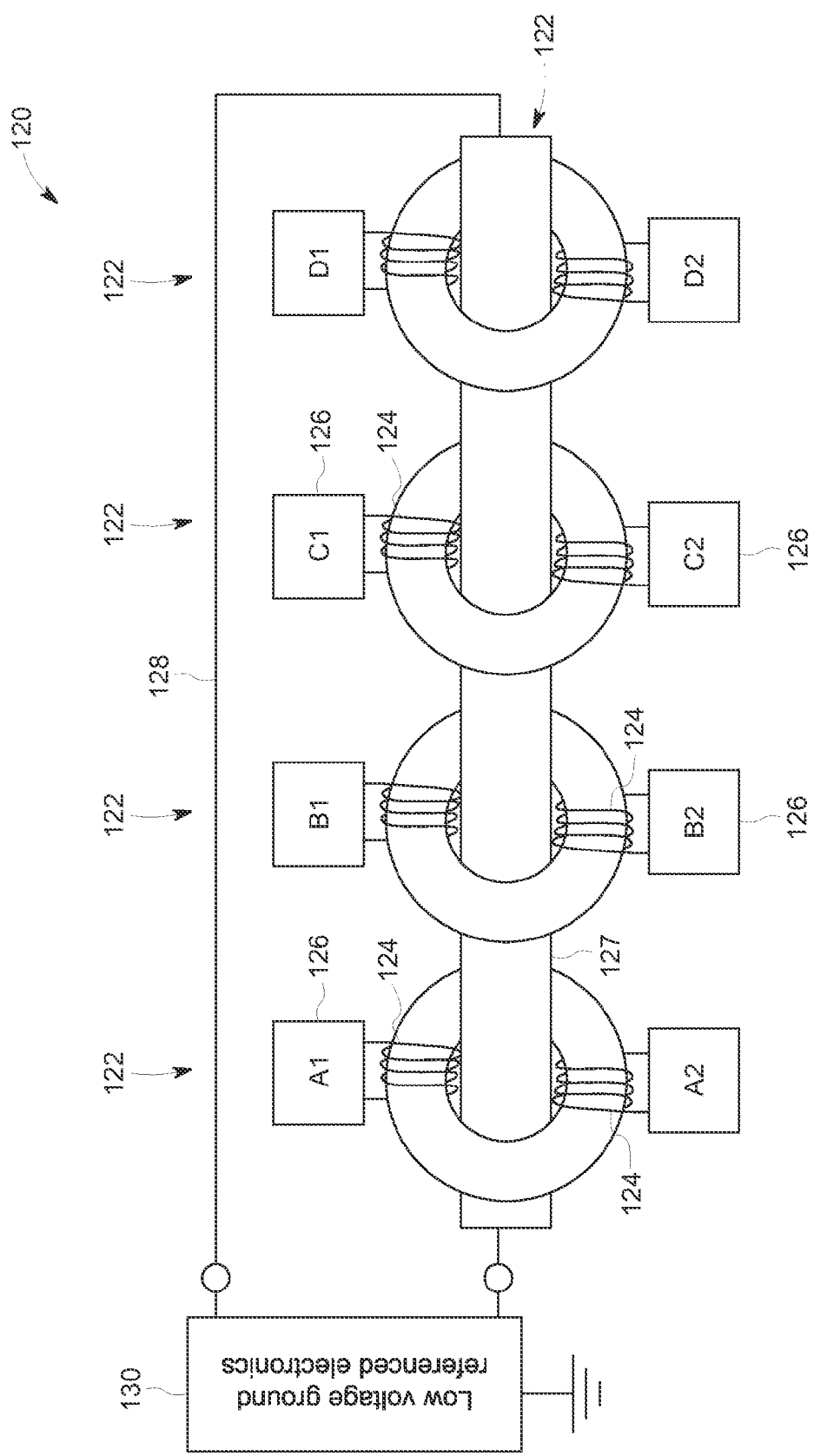
FIG. 10 is a diagram illustrating transformers in accordance with various embodiments.

The voltage switching control of various embodiments, thus, may be implemented as generally illustrated in FIG. 10. For example, the switching control may be implemented with transformers 120 (operating as a high voltage generator) with a primary winding 122 on each side. The transformer 120 includes a plurality of secondary windings 124 connected with each of the primary windings 122 and with a drive arrangement 126, which may be the passive drive arrangement 30 or active drive arrangement 80. The illustrated embodiment shows eight secondary windings 124: four toroids with two windings each, connected with each of the primary windings 122. However, additional toroids or windings per toroid may be provided. Additionally, although the primary windings 122 (also referred to as the primaries) of the transformers 120 are connected in series, a parallel, or cascaded connection of the primary side of the isolation transformers 120 may be provided.

It should be noted that in the illustrated embodiment, the section 127 of the primary windings 122 is insulated, while the section 128 of the primary windings 122 may not be insulated. It also should be noted that additional transformers may be provided, for example, up to forty or more. The primary windings 122 are also connected to low voltage ground referenced electronics 130 to generate the voltage pulses as described herein.

It further should be noted that the drive arrangements 126 connected with the secondary windings 124 are used to control voltage switching as described in more detail herein. It additionally should also be noted that the drive arrangements may include protection elements as desired or needed.

In operation, various embodiments allow control of two or more sets of devices that can be at the same voltage reference and/or different voltage references. The voltage references (as well as the number and value of each) may be varied as desired or needed, as well as the values of the component parts of the various embodiments. It should be noted that the various embodiments can control two or more sets of devices independently, as well as at two or more different frequencies, although the frequencies are integer multiples of each other.

Figure 11:
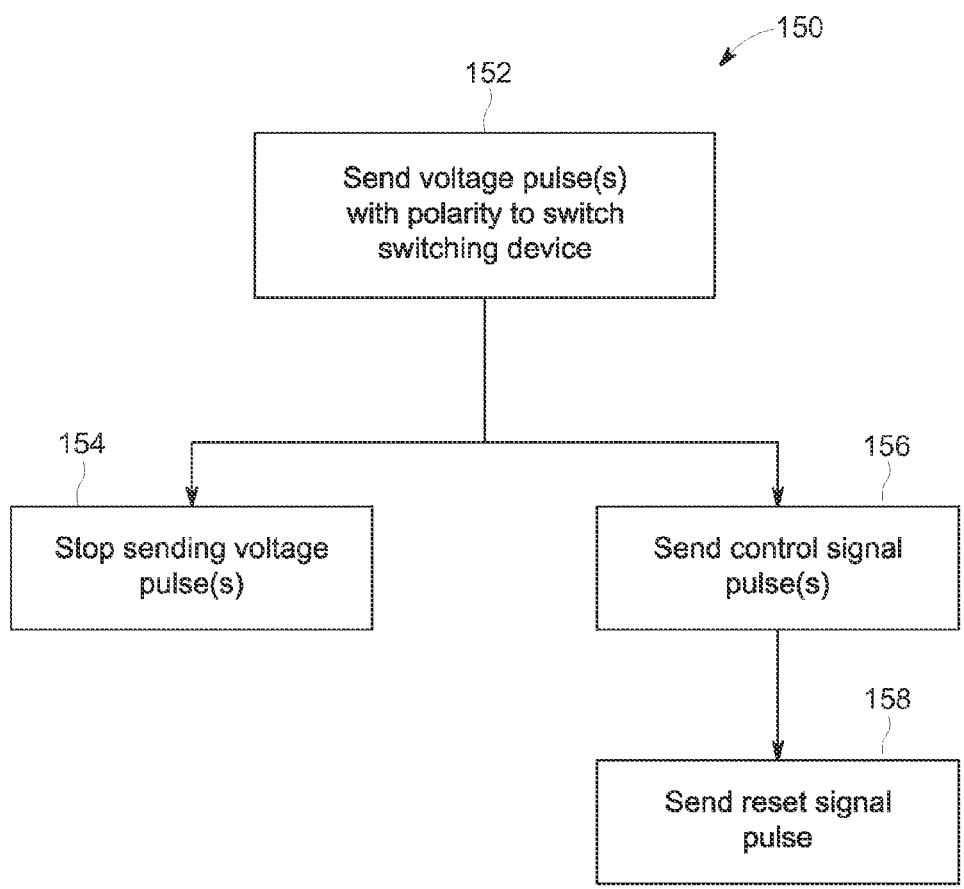
FIG. 11 is a flowchart of a method for controlling voltage switching in accordance with various embodiments.

Various embodiments provide a method 150 as shown in FIG. 11 for controlling voltage switching, for example, to control switching of a plurality devices that are referenced to different voltages, which in some embodiments, are high voltages (e.g., 10 kV or higher). The method 150 includes sending one or more voltage pulses through the primary of one or more transformers as described herein. The voltage pulses have a polarity to turn on one of two switching devices in some embodiments. In a passive control arrangement as described herein, the switching device is turned off by stopping the sending of the voltage pulses. In an active control arrangement, the voltage pulses provide power signals to the switching devices from an on-board power supply. In this embodiment, one or more control signal pulses (e.g., odd or even number of pulses) may be sent to turn on or off the switching devices. Additionally, a reset signal pulse may be sent to reset the switching to a default operating mode, for example, a default operating mode of a flip-flop as described herein.

Figure 13:
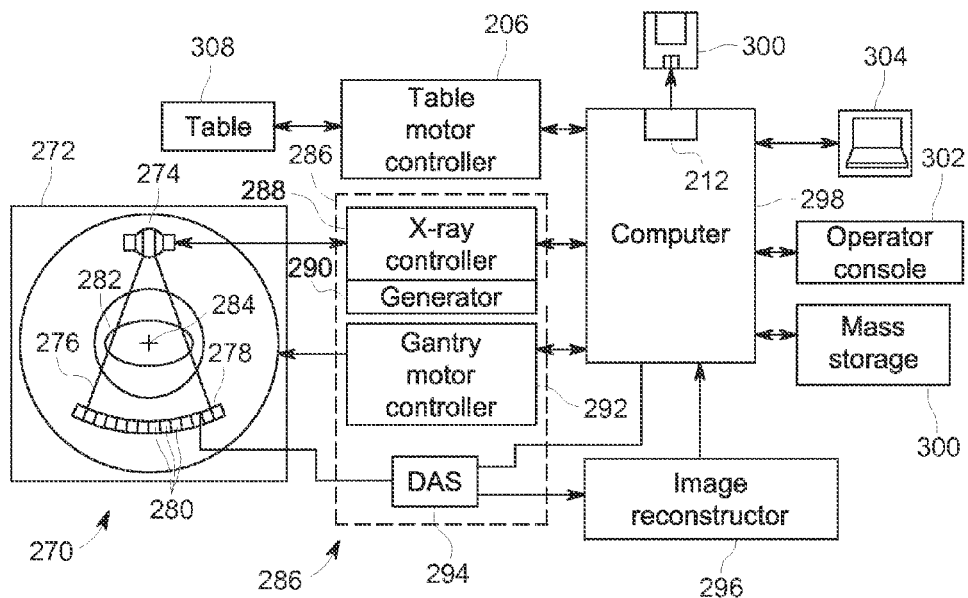
FIG. 13 is a block schematic diagram of the CT imaging system of FIG. 8.
Figure 14:
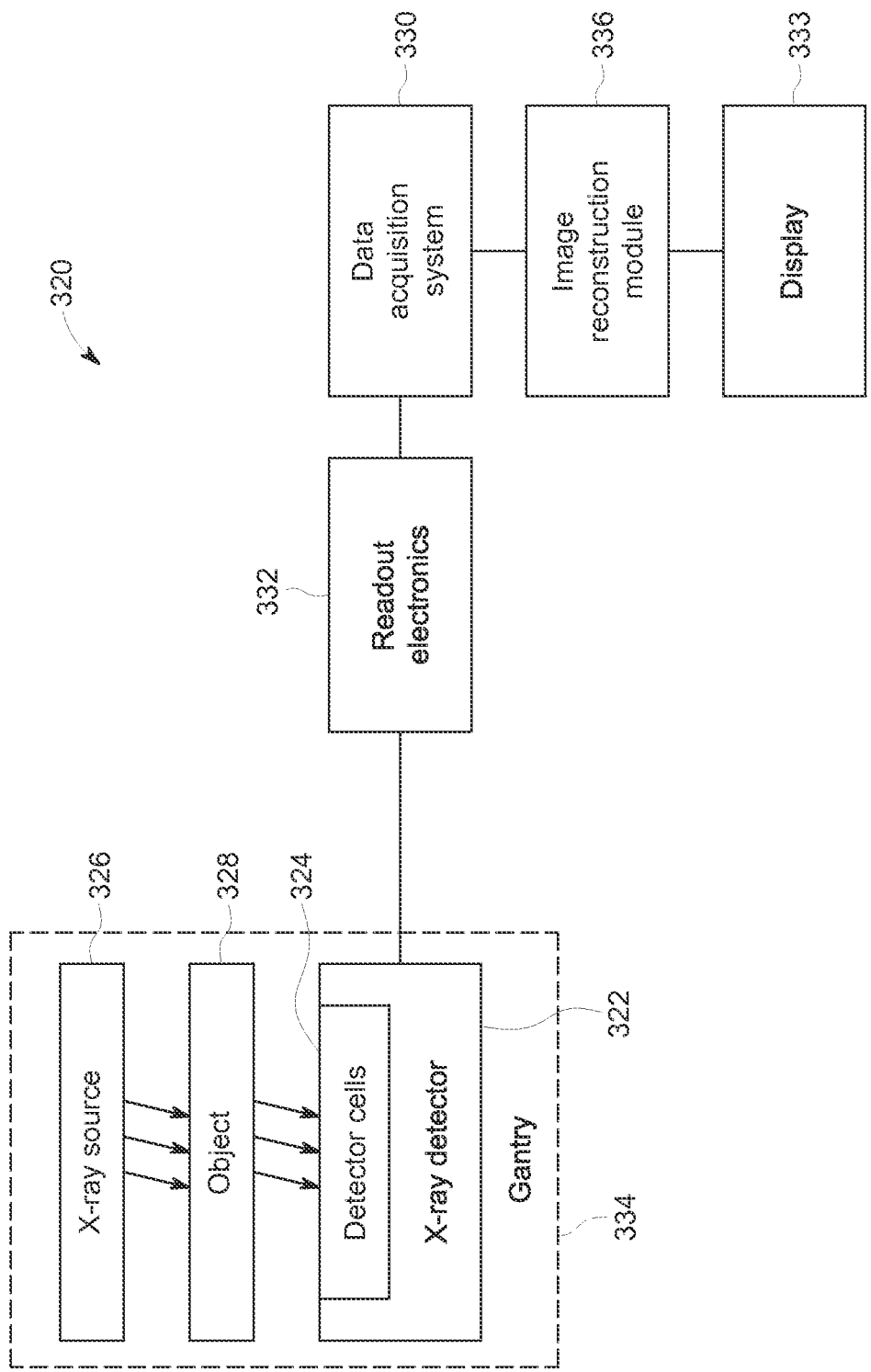
FIG. 14 is a schematic block diagram of an x-ray imaging system in connection with which various embodiments may be implemented.

The various embodiments may be implemented in different systems using high-voltage sources. For example, the various embodiments may be implemented in connection with a CT imaging system as shown in FIGS. 12 and 13, or an X-ray imaging system as shown in FIG. 14, which may be a radiographic or X-ray tomosynthesis system.

Figure 12:
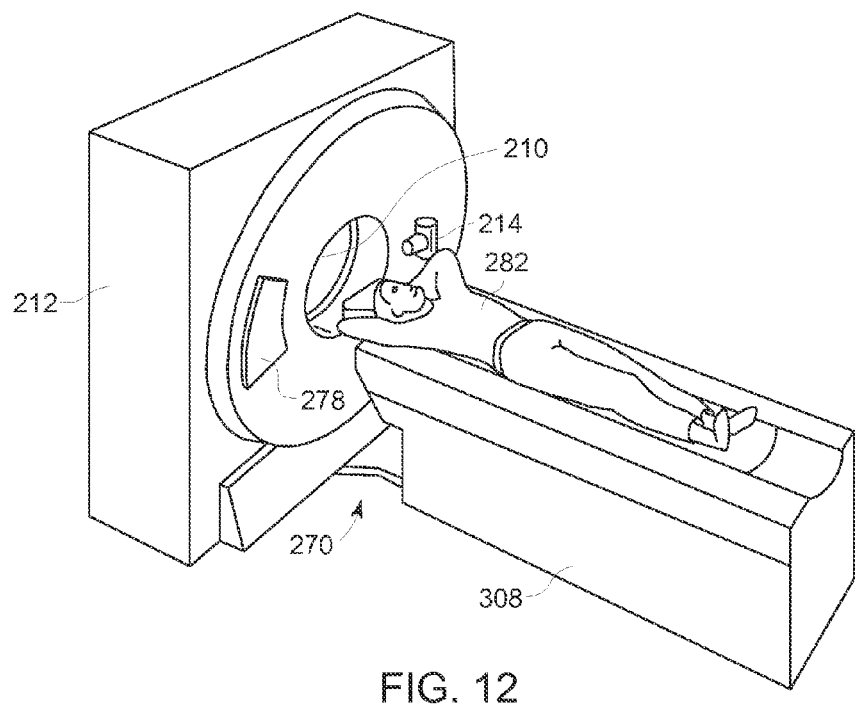
FIG. 12 is a pictorial view a computed tomography (CT) imaging system in connection with which various embodiments may be implemented.

In particular, FIG. 12 is a pictorial view of a CT imaging system 270. FIG. 13 is a block schematic diagram of the system 270 illustrated in FIG. 8. In the exemplary embodiment, the CT imaging system 270 is shown as including a gantry 272 representative of a "third generation" CT imaging system. The gantry 272 has an X-ray source 274 that projects a cone beam 276 of X-rays toward a detector array 278 on the opposite side of gantry 272.

The detector array 278 is formed by a plurality of detector rows (not shown) including a plurality of detector elements 280 that together sense the projected X-ray beams that pass through an object, such as a medical patient 282 or piece of baggage. Each detector element 280 produces an electrical signal that represents the intensity of an impinging X-ray radiation beam and hence the attenuation of the beam as it passes through object or patient 282. The imaging system 270 having a multislice detector 278 is capable of providing a plurality of images representative of a volume of object 282. Each image of the plurality of images corresponds to a separate "slice" of the volume. The "thickness" or aperture of the slice is dependent upon the height of the detector rows.

During a scan to acquire X-ray projection data, a rotating portion (not shown) within the gantry 272 and the components mounted thereon rotate about a center of rotation 284. FIG. 13 shows only a single row of detector elements 280 (i.e., a detector row). However, the multislice detector array 278 includes a plurality of parallel detector rows of detector elements 280 such that projection data corresponding to cone-beam geometry can be acquired simultaneously during a scan.

Rotation of the gantry 272 and the operation of radiation source 274 are governed by a control mechanism 286. The control mechanism 286 includes an X-ray controller 288 and generator 290 that provides power and timing signals to the x-ray source 274 (such as using the passive drive arrangement 30 or active drive arrangement 80) and a gantry motor controller 292 that controls the rotational speed and position of rotating portion of gantry 272. A data acquisition system (DAS) 294 in the control mechanism 286 samples analog data from detector elements 280 and converts the data to digital signals for subsequent processing. An image reconstructor 296 receives sampled and digitized measurement data from the DAS 294 and performs high-speed image reconstruction. The reconstructed image is applied as an input to a computer 298 that stores the image in a mass storage device 300. Although shown as a separate device, image reconstructor 296 may be a special hardware located inside computer 298 or software executing within computer 298.

The computer 298 also receives commands and scanning parameters from an operator via a console 302 that has a keyboard and/or other user input device(s). An associated display system 304 allows the operator to observe the reconstructed image and other data from the computer 298. The operator supplied commands and parameters are used by the computer 298 to provide control signals and information to the DAS 294, x-ray controller 288, generator 290, and gantry motor controller 292. In addition, the computer 298 operates a table motor controller 306 that controls a motorized table 308 to position the patient 182 or object in the gantry 272. The table 308 moves portions of the patient 272 through a gantry opening 310.

In one embodiment, the computer 298 includes a device 312, for example, a CD-ROM drive, DVD-ROM drive, or a solid state hard drive for reading instructions and/or data from a computer-readable medium 314, such as a CD-ROM, or DVD. It should be understood that other types of suitable computer-readable memory are recognized to exist (e.g., CD-RW and flash memory, to name just two), and that this description is not intended to exclude any of these. In another embodiment, the computer 298 executes instructions stored in firmware (not shown). Generally, a processor in at least one of the DAS 294, reconstructor 296, and computer 298 shown in FIG. 13 is programmed to execute control commands to perform switching as described in more detail herein. The switching is not limited to practice in the CT system 270 and can be utilized in connection with many other types and variations of imaging systems. In one embodiment, the computer 298 is programmed to perform different functions to switch the switching devices described herein, accordingly, as used herein, the term computer is not limited to just those integrated circuits referred to in the art as computers, but broadly refers to computers, processors, microcontrollers, microcomputers, programmable logic controllers, application specific integrated circuits, and other programmable circuits.

FIG. 14 illustrates an x-ray imaging system 320 in which various embodiments may be implemented. The imaging system 320 generally includes an X-ray detector 322 having an array of detector cells 324 defining a scan area, and an X-ray source 326. An object 328, such as a patient or piece of luggage is positioned between the X-ray source 326 (the voltage switching of which may be controlled using the passive drive arrangement 30 or active drive arrangement 80) and the X-ray detector 322, which may be one or more detectors or detector modules. However, the imaging system 320 may also scan other objects, such as in an industrial inspection application. The imaging system 320 also includes a data acquisition system 330, which interacts with readout electronics 332. The readout electronics 332 may reside inside X-ray detector 322 or the data acquisition system 330.

In one embodiment, the X-ray detector(s) 322 may be flat-panel detector systems such as an amorphous silicon flat panel detector or other type of digital X-ray image detector, such as a direct conversion type detector, as is known to those skilled in the art. In another embodiment, the X-ray detector(s) 322 may include a scintillator having a screen that is positioned in front of the X-ray detector(s) 322.

It should be noted that the imaging system 320 may be implemented as a non-mobile or mobile imaging system. Moreover, the imaging system 320 may be provided in different configurations. For example, image data may be generated with the X-ray source 326 at discrete foci along a small arc above the object to generate the image information using computed tomosynthesis procedures and processes (or may be in a radiographic configuration). In other embodiments, the X-ray source 326 and the X-ray detector 322 are both mounted at opposite ends of a gantry 334, which may be a C-arm that rotates about the object 328. The rotatable C-arm is a support structure that allows rotating the X-ray source 326 and the X-ray detector 322 around the object 328 along a substantially circular arc, to acquire a plurality of projection images of the object 328 at different angles (e.g., different views or projections) that are typically less than 360 degrees, but may comprise a complete rotation in some instances.

In operation, the object 328 is positioned in the imaging system 320 for performing an imaging scan. For example, the X-ray source 326 may be positioned above, below or around the object 328. For example, the X-ray source 326 (and the X-ray detector(s) 322) may be moved between different positions around the object 328 using the gantry 334. X-rays are transmitted from the X-ray source 326 through the object 328 to the X-ray detector(s) 322, which detect X-rays impinging thereon.

The readout electronics 332 may include a reference and regulation board (RRB) or other data collection unit. The RRB may accommodate and connect data modules to transfer data (e.g., a plurality of views or projections) from the X-ray detector(s) 322 to the data acquisition system 330. Thus, the readout electronics 332 transmit the data from the X-ray detector(s) 322 to the data acquisition system 330. The data acquisition system 330 forms an image from the data and may store, display (on the display 333), and/or transmit the image. For example, the various embodiments may include an image reconstruction module 336, which may be implemented in hardware, software, or a combination thereof, that allows the data acquisition system to reconstruct images using X-ray data (e.g., radiographic or tomosynthesis data) acquired from the X-ray detector(s) 322 and as described in more detail herein.

One or more embodiments of the inventive subject matter described herein also may be used as switch devices in a switching system (e.g., gate drive devices) that control conduction of current to electric machines, such as gate drive devices that separately control conduction of different phases of current to ESPs or other electric machines. The inventive subject matter simplifies the gate driver design and circuit that are usable under high temperature conditions (e.g., greater than 150 degrees Celsius), without requiring the use of high temperature power supplies or gate driver chips. The devices described herein may use passive components and reliable signal transistors to control the electric machines. The inventive subject matter increases the reliability of the switch devices, and is scalable to different voltage rating designs, thereby reducing or eliminating the re-design of gate drives and reducing the cost of using the gate drives.

In one aspect, the inventive subject matter described herein provides several gate drive unit topologies for a high-voltage, bi-directional (e.g., in voltage and current) solid-state switch devices using (in one embodiment) silicon carbide (SiC) devices in harsh operating environments, such as those environments experienced by downhole switches or aviation applications. The switch devices described herein can be low profile, small footprint passive components with high reliability under high temperature conditions. The insulation and signal synchronization between different switch devices can be achieved by a passive high-frequency transformer. The gate drive units provide the circuit variations to achieve functions such as negative bias voltage and fast turn-off speeds.

In one embodiment, a high frequency pulse signal can be generated on the primary side of a transformer that fans out multiple signals on the secondary side of the transformer. The pulse signal can be rectified and charge gate capacitors to turn on the switching devices. Positive and negative pulses can separately control plural switching devices, which can be anti-series connected. A negative bias voltage can be generated by an additional transformer. The bias voltage can be applied to a gate of a switching device to effectively increase the activation voltage of the switching device. For example, the activation voltage of the switching device may be increased by the absolute value of the bias voltage. High temperature signal transistors can help provide fast turn-off speed and reduce gate loop impedance when the switching devices are in an off-state.

Figure 15:
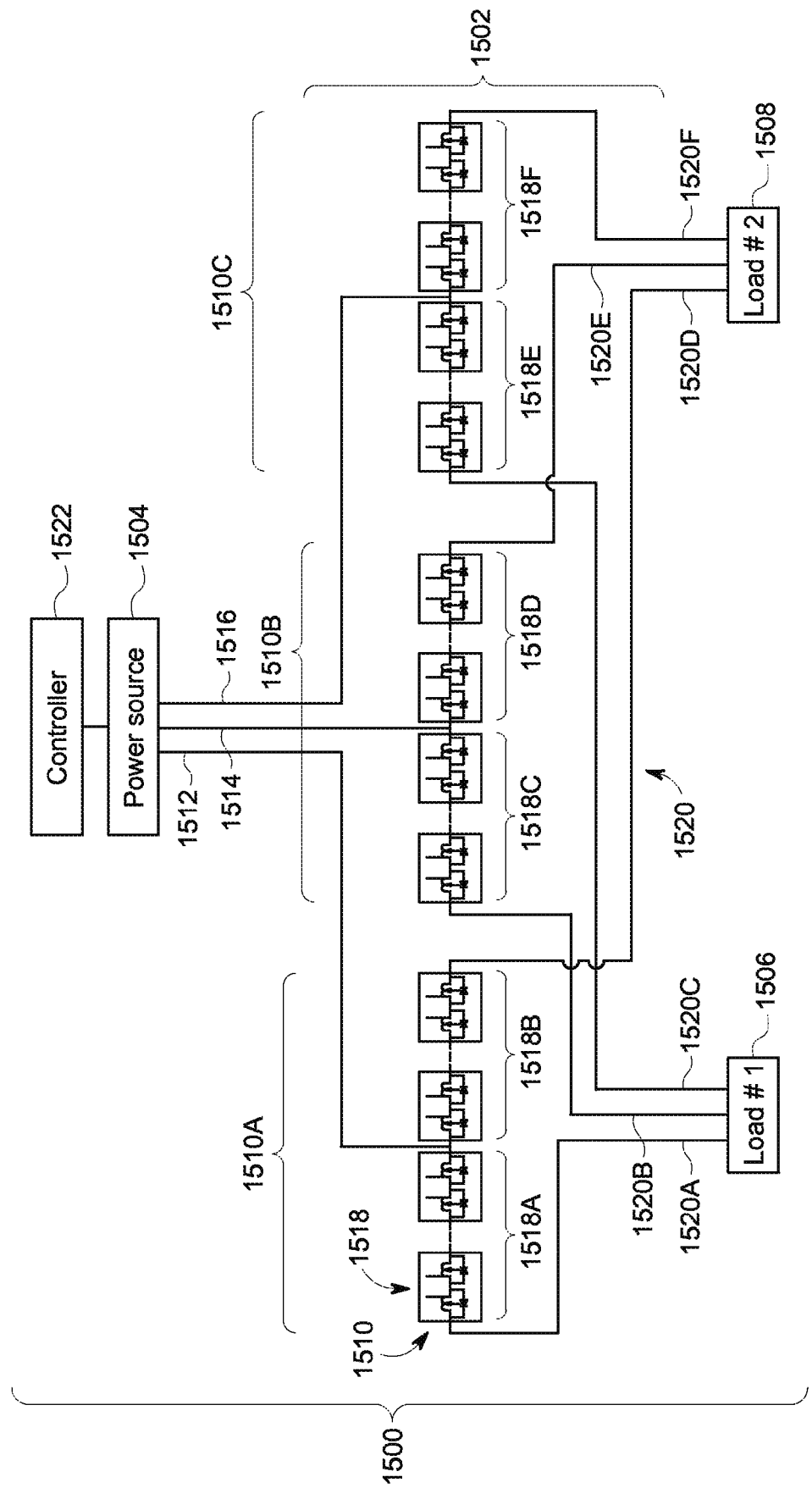
FIG. 15 illustrates a power system and a switching system according to one embodiment.

FIG. 15 illustrates a power system 1500 and a switching system 1502 according to one embodiment. The power system 1500 includes a power source 1504 that provide electric power (e.g., electric current, such as alternating current) to plural loads 1506, 1508 (e.g., "Load #1" and "Load #2" in FIG. 15). While two loads 1506, 1508 are shown in FIG. 15, alternatively, more than two loads 1506, 1508 or a single load 1506, 1508 may be included in the power system 1500. The loads 1506, 1508 can represent subterranean pumps that pump resources (e.g., oil, gas, etc.) from beneath the surface of the earth to a location above the surface of the earth. The switching system 1502 includes several switching assemblies 1510 (e.g., switching assemblies 1510A-C) that control conduction of the current from the power source 1504 to the loads 1506, 1508. In one embodiment, the switching assemblies 1510 include gate drive circuits and switching devices that are the same as or similar to the gate drive circuits 36 and switching devices 38 described above. The power source 1504 can be conductively coupled with the switching assemblies 1510 by cables 1512, 1514, 1516. In the illustrated embodiment, the power source 1504 supplies a different phase of alternating current along different cables 1512, 1514, 1516. For example, a first phase of alternating current can be conducted from the power source 1504 to the switching assembly 1510A, a different, second phase of the alternating current can be conducted from the same power source 1504 to the switching assembly 1510B, and a different, third phase of the alternating current can be conducted from the same power source 1504 to the switching assembly 1510C.

The switching assemblies 1510 may include bi-directional switch cells 1518 (e.g., cells 1518A-F). The switch cells 1518 optionally may be referred to as passive drive arrangements, similar or identical to the passive drive arrangement 30 shown in FIG. 2. The switch cells 1518 are conductively coupled with the loads 1506, 1508 by wires or cables 1520 (e.g., wires 1520A-F). In the illustrated embodiment, each of the switching assemblies 1510 includes four switch cells 1518. Alternatively, the switching assemblies 1510 can include a different number of switch cells 1518, or a single switch cell 1518.

The switch cells 1518 can include plural switching devices that can alternate between closed (e.g., conducting) and open (e.g., non-conducting) states to control the conduction of current between the power source 1504 and one or more of the loads 1506, 1508. For example, each pair of switch cells 1518 can operate as a switch to cut off conduction or conduct electric current through the pair of switch cells 1518. The switch cell 1518A in the switching assembly 1510A can close in order to conduct a first phase of the electric current supplied from the power source 1504 (e.g., along the cable 1512) to the first load 1506 along the wire 1520A. The switch cell 1518A in the switching assembly 1510A can open in order to stop conduction of the first phase of the electric current supplied from the power source 1504 (e.g., along the cable 1512) to the load 1506 along the wire 1520A. The switch cell 1518B in the switching assembly 1510A can close in order to conduct the first phase of the electric current supplied from the power source 1504 (e.g., along the cable 1512) to the second load 1508 along the wire 1520D. The switch cell 1518B in the switching assembly 1510A can open in order to stop conduction of the first phase of the electric current supplied from the power source 1504 along the cable 1512 to the second load 1508 along the wire 1520D.

The switch cells 1518C in the switching assembly 1510B can close in order to conduct a different, second phase of the electric current supplied from the power source 1504 (e.g., along the cable 1514) to the first load 1506 along the wire 1520B. The switch cell 1518C in the switching assembly 1510B can open in order to stop conduction of the second phase of the electric current supplied from the power source 1504 (e.g., along the cable 1514) to the load 1506 along the wire 1520B. The switch cell 1518D in the switching assembly 1510B can close in order to conduct the second phase of the electric current supplied from the power source 1504 (e.g., along the cable 1514) to the second load 1508 along the wire 1520E. The switch cell 1518D in the switching assembly 1510B can open in order to stop conduction of the second phase of the electric current supplied from the power source 1504 along the cable 1514 to the second load 1508 along the wire 1520E.

The switch cell 1518E in the switching assembly 1510C can close in order to conduct a different, third phase of the electric current supplied from the power source 1504 (e.g., along the cable 1516) to the first load 1506 along the wire 1520C. The switch cell 1518E in the switching assembly 1510C can open in order to stop conduction of the third phase of the electric current supplied from the power source 1504 (e.g., along the cable 1516) to the load 1506 along the wire 1520C. The switch cell 1518F in the switching assembly 1510C can close in order to conduct the third phase of the electric current supplied from the power source 1504 (e.g., along the cable 1516) to the second load 1508 along the wire 1520F. The switch cell 1518F in the switching assembly 1510C can open in order to stop conduction of the third phase of the electric current supplied from the power source 1504 along the cable 1516 to the second load 1508 along the wire 1520F. Alternatively, a single switch cell 1518 may open or close to stop conduction or conduct, respectively, a phase of electric current from one of the cables 1512, 1514, 1516 to one of the wires 1520.

The switch cells 1518 open or close based on gate drive signals conducted (or not conducted) to the switching devices in the switch cells 1518 of the switching assemblies 1510. By controlling which switching devices in the switch cells 1518 are open or closed at different times, the conduction of the different phases of the current from the power source 1504 to the loads 1506, 1508 can be controlled. The switching assemblies 1510 can be robust solid state devices that can withstand and continue to operate under high temperature and high pressure conditions (e.g., temperatures of at least 150 to 200 degrees Celsius and/or pressures of at least 130,000 kilopascals). In aspect, the switching devices in the switch cells 1518 include metal oxide semiconductor field effect transistors (MOSFETs) that are formed from silicon carbide (SiC). Alternatively, the switching devices may be another type of solid state switch and/or may be formed from another material.

Figure 16:
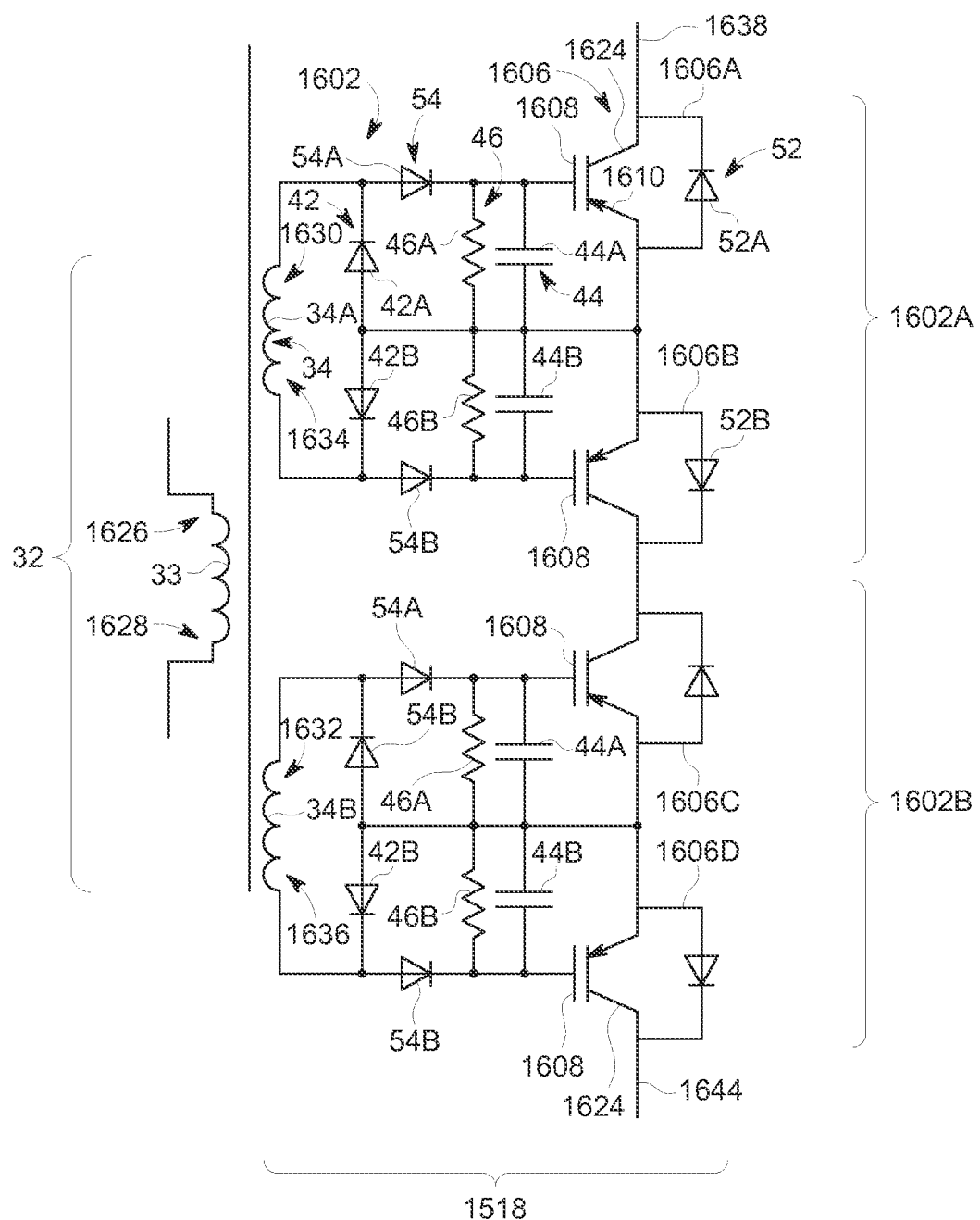
FIG. 16 illustrates one of the switch cells shown in FIG. 15 according to one embodiment.

FIG. 16 illustrates one of the switch cells 1518 shown in FIG. 15 according to one embodiment. Operation of the switch cell 1518 as described herein can be repeated and independently controlled (relative to the other switch cell 1518 in the switching system 1502 (shown in FIG. 15) to independently control when different phases of the current supplied from the power source 1504 are conducted to the different loads 1506, 1508, as described above.

The switch cell 1518 optionally may be referred to as a passive drive arrangement. The switch cell 1518 can include two or more of the passive drive arrangement 30 shown in FIG. 1. The switch cell 1518 can be used to control multiple devices floating at multiple voltages. For example, some embodiments provide control of switches simultaneously or concurrently when the switches are referenced to high voltages, including when referenced to multiple high voltages. By practicing one or more embodiments, control of switches for voltages applied or referenced to multiple devices may be simplified, including having controls with less components and being less complex. By practicing one or more embodiments, a plurality of switches (e.g., two switches) may be independently controlled with a single transformer winding. Thus, in various embodiments, one or more controls or functions may be performed using a single component, such as a single transformer or transformer winding. Accordingly, a reduced number of transformers or other control devices may be used in various embodiments. Additionally, a reduced cost or size of the transformers may be provided in some embodiments. For example, in high voltage circuits, the cost and size of the transformers is primarily due to the high voltage insulation used, which can be reduced by practicing one or more embodiments.

The switch cell 1518 may be used to control switching of power from the transformer 32 having a primary winding 33 and plural secondary windings 34 (e.g., secondary windings 34A, 34B). The primary winding 33 of the transformer 32 is conductively coupled with at least one of the cables 1512, 1514, 1516 (shown in FIG. 15) to receive electric current from the power source 1504. The switch cell 1518 includes gate drive circuits 1602 (e.g., circuits 1602A, 1602B) that may be similar to the gate drive circuit 36 shown in FIG. 2.

The gate drive circuits 1602 control the power supplied to plural switching devices 1606 (e.g., switching devices 1606A-D), which are illustrated as IGBTs. It should be appreciated, however, that different switching devices may be used, for example MOSFETs or different types of transistors. Additionally, it should be noted that the switching devices may be formed using silicon (Si), silicon carbide (SiC), gallium nitride (GaN), or any other material suitable to build controllable solid state devices. In various embodiments, the gate drive circuit 1602 controls drive signals that are conducted to gates 1608 of the switching devices 1606.

The gate drive circuits 1602 includes the diodes 42 (e.g., the diodes 42A, 42B) connected through the diodes 54 (e.g., the diodes 54A, 54B) with the capacitors 44 (e.g., the capacitors 44A, 44B), which are connected in parallel with the resistors 46 (e.g., the resistors 46A, 46B). This parallel connection arrangement is illustrated as connected across the secondary windings 34 of the transformer 32. These components are connected, as different sets of components, across the gates 1608 and emitters 1610 of the switching devices 1606. For example, a first set of components that includes the diode 42A, the diode 54A, the resistor 46A, and the capacitor 44A are connected across the gate 1608 and the emitter 1610 of the switching device 1606A in the gate drive circuit 1602A and a second set of components that includes the diode 42B, the diode 54B, the resistor 46B, and the capacitor 44B are connected across the gate 1608 and the emitter 1610 of the switching device 1606B in the gate drive circuit 1602B. As shown in FIG. 16, a third set of components that includes the diode 42A, the diode 54A, the resistor 46A, and the capacitor 44A are connected across the gate 1608 and the emitter 1610 of the switching device 1606C in the gate drive circuit 1602B and a fourth set of components that includes the diode 42B, the diode 54B, the resistor 46B, and the capacitor 44B are connected across the gate 1608 and the emitter 1610 of the switching device 1606D in the gate drive circuit 1602B.

Additional diodes 52 (e.g., the diodes 52A, 52B) are also connected between the emitters 1610 and collectors 1624 of the switching devices 1606. For example, the diode 52A may be connected between the emitter 1610 and collector 1624 of the switching device 1606A, and the diode 52B may be connected between the emitter 1610 and collector 1624 of the switching device 1606B to complete the circuit. Diodes 52 also are connected between the emitters 1610 and collectors 1624 of the switching devices 1606C, 1606D, as shown in FIG. 16. It should be noted that in some embodiments, the switching devices 1606 may be connected, for example, in a common emitter configuration.

The diodes 42A, 42B and the diodes 52A, 52B in each of the sets of components are connected in opposing directions, illustrated as having anodes thereof connected to each other, so that the diodes 42A, 42B restrict conduction of current to opposite directions and the diodes 52A, 52B restrict conduction of current to opposite directions, as shown in FIG. 16. The diodes 54 are connected between the diodes 42 and the resistors 46, and between the diodes 42 and the capacitors 44. In particular, the cathodes of the diodes 42A and 42B are connected to the anodes of the diodes 54A and 54B, respectively.

Figure 17:
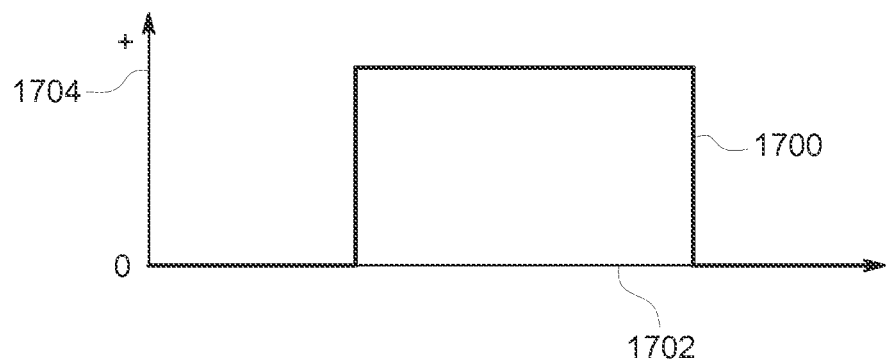
FIG. 17 illustrates one example of a positive pulse voltage.

In operation, the power source 1504 can conduct a positive pulse voltage 1700 along a cable 1512, 1514, 1516 to the primary winding 33 of the transformer 32. FIG. 17 illustrates one example of a positive pulse voltage 1700. The positive pulse voltage 1700 is shown alongside a horizontal axis 1702 representative of time and a vertical axis 1704 representative of magnitudes of positive voltage.

This positive pulse voltage can cause a positive potential to be applied at or near one end 1626 of the primary winding 33 and a negative potential to be applied at or near an opposite end 1628 of the primary winding 33. The transformer 32 transfers these potentials to the secondary windings 34 such that a first end 1630 of the secondary winding 34A and a first end 1632 of the secondary winding 34B have positive potentials and opposite second ends 1634, 1636 of the secondary windings 34A, 34B have negative potentials.

With respect to the gate drive circuit 1602A, the positive pulse voltage is conducted as current through the diode 54A to the capacitor 44A to charge the capacitor 44A. The power source 1504 can include and/or be controlled by a controller 1522, which can represent hardware circuitry that includes and/or is connected with one or more processors (e.g., microprocessors, field programmable gate arrays, integrated circuits, or other electronic logic-based devices) and/or input devices (e.g., buttons, switches, keyboards, etc.) that control the pulses, voltages, currents, switches (e.g., the mechanical switch 2506 shown in FIG. 25 and described below) conducted to the different gate drive circuits 1602 in the switch cells 1518 shown in FIG. 15.

The current is conducted from the capacitor 44A and through the diode 42B back to the secondary winding 34A of the transformer 32. The capacitors 44A in the gate drive circuits 1602A, 1602B can charge to an energy level that is at or above a threshold charged voltage state $V_C$ that is sufficiently large to apply the voltage to the gate 1608 of the switching device 1606A and cause the switching device 1606A to activate (e.g., close) and conduct current through the switching device 1606A to the collector 1624 of the switching device 1606A. For example, the charged voltage state may be larger than an activation voltage of the switching device 1606A. The activation voltage may be fifteen volts in one embodiment. Alternatively, the activation voltage may be larger or smaller.

The current may then be conducted out of the gate drive circuit 1602A and the switch cell 1518 via a conductive pathway 1638, which may represent or be conductively coupled with one or more of the wires 1520 (shown in FIG. 15). The phase of the current being conducted through the gate drive circuit 1602A may then be conducted to one or more of the loads 1506, 1508 (shown in FIG. 15) via the corresponding wire 1520.

The power source 1504 can stop conducting the positive pulse voltage to the transformer 32 and, consequently, stop charging the capacitor 44A in the gate drive circuit 1602A. The energy that is stored in the capacitor 44A may then be conducted out of the capacitor 44A as a discharge current. The discharge current can be conducted in a loop between the capacitor 44A and the resistor 46A in the gate drive circuit 1602A to dissipate this stored energy. Responsive to the charged voltage state ($V_C$) in the capacitor 44A dropping below the activation voltage of the switching device 1606A, the switching device 1606A may deactivate (e.g., open) and stop conducting current to the conductive pathway 1638. As a result, the phase of the current being conducted through the gate drive circuit 1602A to one or more of the loads 1506, 1508 via one or more of the pathways 1520 may stop being conducted to the load 1506, 1508.

Figure 18:
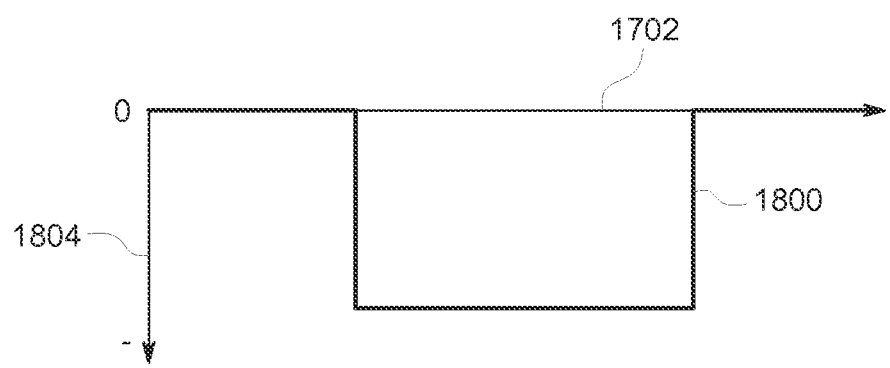
FIG. 18 illustrates one example of a negative pulse voltage.

The power source 1504 can conduct a negative pulse voltage 1800 along a cable 1512, 1514, 1516 to the primary winding 33 of the transformer 32. FIG. 18 illustrates one example of a negative pulse voltage 1800. The negative pulse voltage 1800 is shown alongside the horizontal axis 1702 and a vertical axis 1804 representative of magnitudes of negative voltage.

The negative pulse voltage can cause a negative potential to be applied at or near the end 1626 of the primary winding 33 and a positive potential to be applied at or near the opposite end 1628 of the primary winding 33. The transformer 32 transfers these potentials to the secondary windings 34 such that the first ends 1630, 1632 of the secondary windings 34A, 34B have negative potentials and the second ends 1634, 1636 of the secondary windings 34A, 34B have positive potentials.

With respect to the gate drive circuit 1602B, the negative pulse voltage is conducted as current through the diode 54B to the capacitor 44B to charge the capacitor 44B with a positive voltage. The current is conducted from the capacitor 44B and through the diode 42B back to the secondary winding 34B of the transformer 32. The capacitor 44B in the gate drive circuit 1602B can charge to an energy level that is at or above a threshold charged voltage state $V_C$ that is sufficiently large to apply the voltage to the gate 1608 of the switching device 1606D and cause the switching device 1606D to activate (e.g., close) and conduct current through the switching device 1606D to the collector 1624 of the switching device 1606D. The current may then be conducted out of the gate drive circuit 1602B and the switch cell 1518 via a conductive pathway 1644, which may represent or be conductively coupled with one or more of the wires 1520. The phase of the current being conducted through the gate drive circuit 1602B may then be conducted to one or more of the loads 1506, 1508 (shown in FIG. 15) via the corresponding wire 1520.

The conductive pathways 1638, 1644 of the gate drive circuits 1602A, 1602B may represent or be conductively coupled with different wires 1520, the gate drive circuits 1602A, 1602B can separately control conduction of the same phase of current from the power source 1504 to the different loads 1506, 1508.

The power source 1504 can stop conducting the negative pulse voltage to the transformer 32 and, consequently, stop charging the capacitor 44B in the gate drive circuit 1602B. The energy that is stored in the capacitor 44B may then be conducted out of the capacitor 44B as a discharge current. The discharge current can be conducted in a loop between the capacitor 44B and the resistor 46B in the gate drive circuit 1602B to dissipate this stored energy. Responsive to the charged voltage state ($V_C$) in the capacitor 44B dropping below the activation voltage of the switching device 1606D, the switching device 1606D may deactivate (e.g., open) and stop conducting current to the conductive pathway 1644. As a result, the phase of the current being conducted through the gate drive circuit 1602B to one or more of the loads 1506, 1508 via one or more of the pathways 1520 may stop being conducted to the load 1506, 1508.

Figure 19:
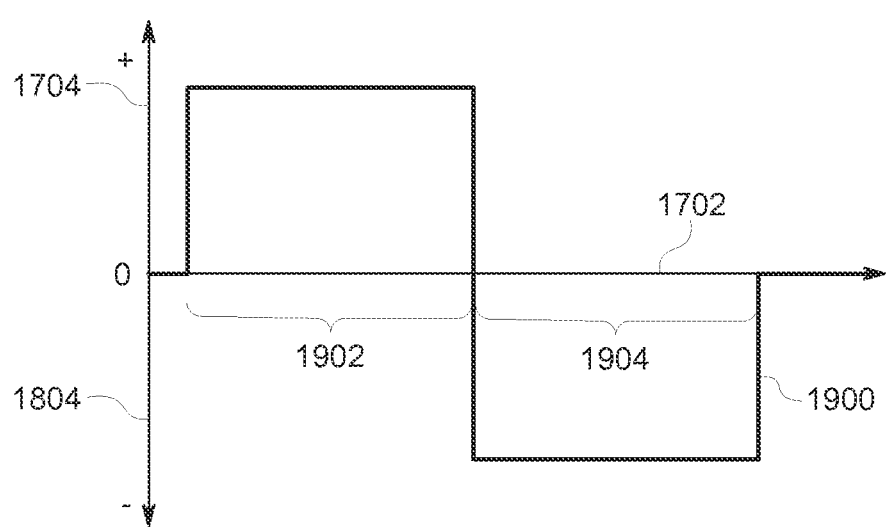
FIG. 19 illustrates one example of an alternating pulse voltage.

In order to activate both switching devices 1606A, 1606D and cause the same phase of current from the power source 1504 to be concurrently or simultaneously conducted to different loads 1506, 1508, an alternating pulse voltage 1900 can be conducted from the power source 1504 to the primary winding 33 of the transformer 32. FIG. 19 illustrates one example of an alternating pulse voltage 1900. The alternating pulse voltage 1900 is shown alongside the horizontal axis 1702 and the vertical axes 1704, 1804.

This alternating pulse voltage can cause a positive potential to be applied at or near the end 1626 of the primary winding 33 and the negative potential to be applied at or near the opposite end 1628 of the primary winding 33 during a first time period 1902 (shown in FIG. 19) in which the alternating pulse voltage includes the positive pulse voltage 1700 shown in FIG. 17. As described above, this positive pulse voltage applied during the first time period can close the switching device 1606A to cause the phase of the current to be conducted to a load 1506, 1508. The alternating pulse voltage can cause a negative potential to be applied at or near the end 1626 of the primary winding 33 and a positive potential to be applied at or near the opposite end 1628 of the primary winding 33 during a different, second time period 1904 (shown in FIG. 19) in which the alternating pulse voltage includes the negative pulse voltage 1800. As described above, this negative pulse voltage applied during the second time period can close the switching device 1606D to cause the phase of the current to be conducted to another load 1506, 1508. The time periods 1902, 1904 may be sufficiently short in duration that the capacitors 44A, 44B in the gate drive circuits 1602A, 1602B maintain charges above the activation thresholds of the switching devices 1606A, 1606D to keep the switching devices 1606A, 1606D closed. Upon removal of the alternating pulse voltage, the capacitors 44 can discharge through the resistors 46 and cause the switching devices 1606A, 1606D to open.

Figure 20:
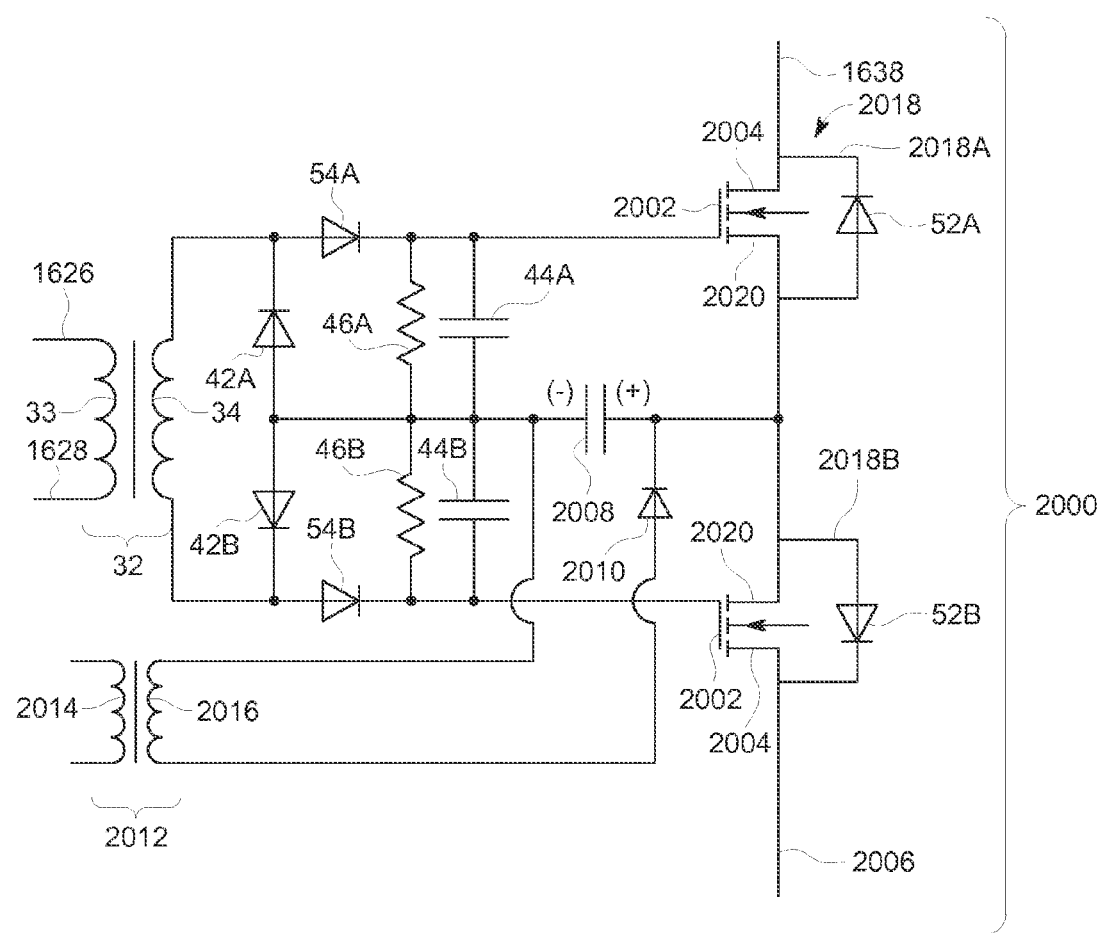
FIG. 20 illustrates another embodiment of a gate drive circuit.

FIG. 20 illustrates another embodiment of a gate drive circuit 2000. The gate drive circuit 2000 may be used in place of one or more of the gate drive circuits 1602 described above. For example, the switching system 1502, switching assemblies 1510, and/or switch cells 1518 shown in FIG. 15 may include one or more gate drive circuits 2000 shown in FIG. 20 in place of one or more of the gate drive circuits 1602.

The gate drive circuit 2000 includes many of the same components as the gate drive circuit 1602. The gate drive circuit 2000 includes different switching devices 2018 (e.g., switching devices 2018A, 2018B), which are illustrated as MOSFETs having gates 2002, sources 2020, and drains 2004. Alternatively, the gate drive circuit 2000 may include the IGBTs shown in FIG. 16 as the switching devices 2018. The gate drive circuit 2000 may be connected to another gate drive circuit 2000 to form a switch cell 1518. For example, the drain 2004 of the switching device 2018B can be conductively coupled with the source 2020 of another switching device of another gate drive circuit to form a switch cell 1518.

The gate drive circuit 2000 includes a second transformer 2012 having a primary winding 2014 and a secondary winding 2016. The secondary winding 2016 is connected with a diode 2010 in series with a capacitor 2008. The capacitor 2008 may be referred to as a voltage bias capacitor. The capacitor 2008 is connected with the capacitors 44 and the switching devices 2018 between the capacitors 2008 and between the switching devices 2018.

The gate drive circuit 2000 may operate in a manner similar to the gate drive circuit 1602. For example, a positive pulse voltage may be applied to the transformer 32 by the power source 1504 (shown in FIG. 15) to charge the capacitor 44A and close the switching device 2018A and no voltage may be applied to the transformer 32 to discharge the capacitor 44A through the resistor 46A and open the switching device 2018A. A negative pulse voltage can be applied to the transformer 32 by the power source 1504 to charge the capacitor 44B in the gate drive circuit 2000 and close the switching device 2018B, no voltage can be applied to open the switching devices 2018A, 2018B, and an alternating pulse voltage can be applied to close the switching devices 2018A, 2018B.

The capacitor 2008 can be used to apply a negative voltage bias to the gate 2002 of the switching device 2018A in the gate drive circuit 2000 to prevent noise or other electrical interference in the gate drive circuit 2000 (e.g., electric signals other than voltages or currents conducted from the power source 1504) from causing the switching device 2018A to close. For example, electrical noise or interference in the gate drive circuit 2000 could charge the capacitor 44A by an amount that is sufficient to meet or exceed the activation voltage of the switching device 2018A in the absence of a sufficient pulse voltage being applied by the power source 1504 to close the switching device 2018A.

To prevent this noise from activating the switching device 2018A, an alternating pulse voltage (e.g., an alternating current, such as the pulse voltage 1900 shown in FIG. 19) may be applied to the second transformer 2012 by the power source 1504 or another power source. For example, the primary winding 2014 of the second transformer 2012 may be conductively coupled with the power source 1504 as described below. The alternating pulse voltage applied to the primary winding 2014 can be transferred to the secondary winding 2016 and then conducted through the diode 2010 to the capacitor 2008. Because the cathode of the diode 2010 is connected in series with the capacitor 2008, the capacitor 2008 can be charged with a voltage having a positive polarity on the side of the capacitor 2008 that is coupled with the cathode of the diode 2010 and a negative polarity on the opposite side of the capacitor 2008.

The negative polarity of the energy stored in the capacitor 2008 is applied to the gate 2002 of the switching device 2018A. The magnitude of the negative polarity of the energy applied to the gate 2002 of the switching device 2018A is based on the magnitude of the alternating current applied to the second transformer 2012. For larger magnitudes of the voltages in the alternating current, the negative polarity applied to the gate 2002 increases while, for smaller magnitudes of the voltages in the alternating current, the negative polarity applied to the gate 2002 decreases.

The negative polarity applied to the gate 2002 of the switching device 2018A effectively increases the activation voltage of the switching device 2018A. The switching device 2018A can be activated (e.g., closes) upon application of a threshold voltage (e.g., +15 volts or another value) to the gate 2002 of the switching device 2018A. But, the negative potential applied to the gate 2002 of the switching device 2018A by the capacitor 2008 increases the amount of positive voltage that needs to be applied to the gate 2002 to activate the switching device 2018A. For example, if the activation voltage of the switching device 2018A is +15 volts and the capacitor 2008 causes −5 volts (or another value) to be applied to the gate 2002, then the capacitor 44A needs to be charged to at least +20 volts so that at least +20 volts is applied to the gate 2002 to activate the switching device 2018A in order to overcome the negative bias applied by the capacitor 2008 and the threshold voltage of the switching device 2018A. Without charging the capacitor 2008 via the second transformer 2012, the capacitor 2008 does not apply a negative bias to the gate 2002 of the switching device 2018A and the switching device 2018A can be activated upon application of lower voltages to the gate 2002 of the switching device 2018A. As a result, applying the negative bias to the gate 2002 can reduce or eliminate instances where electric noise or other interference activates the switching device 2018A.

Figure 21:
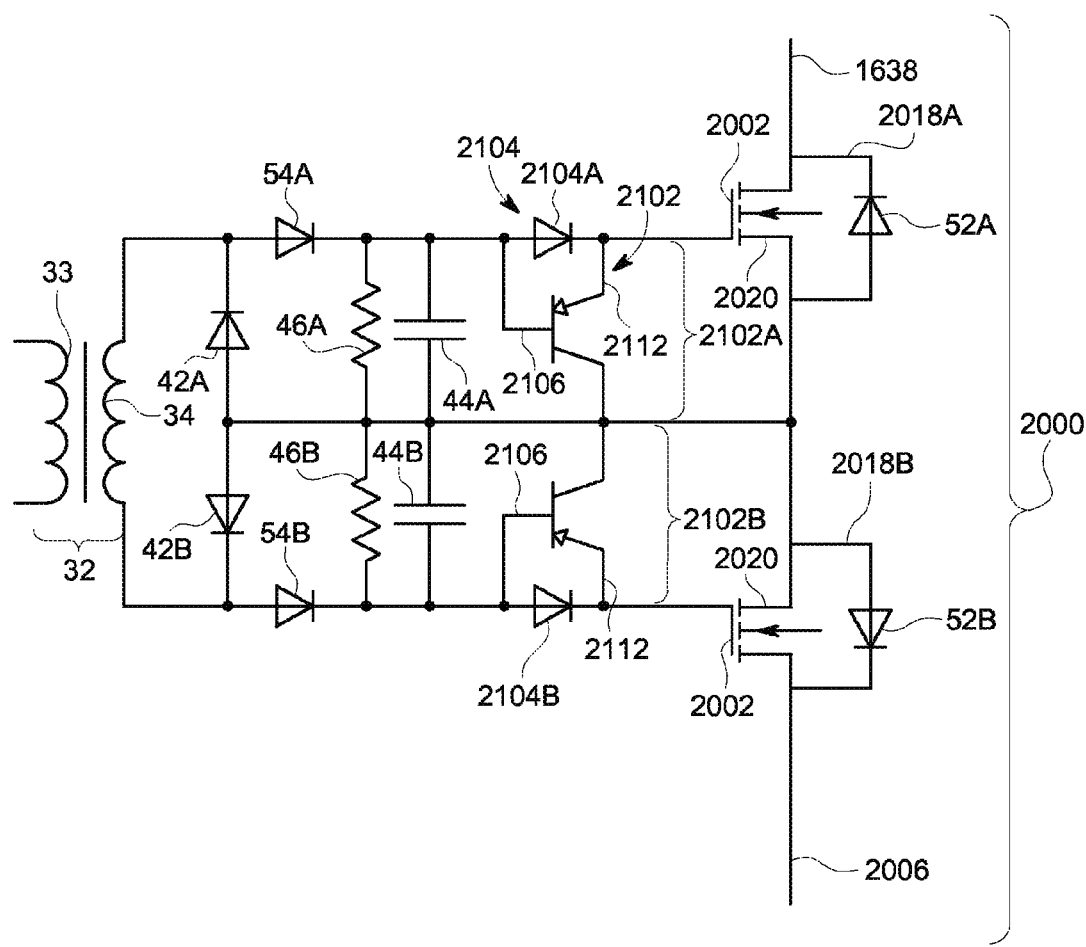
FIG. 21 illustrates another embodiment of a gate drive circuit.

FIG. 21 illustrates another embodiment of a gate drive circuit 2100. The gate drive circuit 2100 may be used in place of one or more of the gate drive circuits 1602, 2000 described above. For example, the switching system 1502, switching assemblies 1510, and/or switch cells 1518 shown in FIG. 15 may include one or more gate drive circuits 2100 shown in FIG. 21 in place of one or more of the gate drive circuits 1602 and/or 2000.

The gate drive circuit 2100 includes many of the same components as the gate drive circuits 1602, 2000. The gate drive circuit 2100 includes additional follower switching devices 2102 (e.g., follower switching devices 2102A, 2102B) and diodes 2104 (e.g., diodes 2104A, 2104B). The following switching devices 2102 are illustrated as BJTs (Bipolar Junction Transitors), but may be other solid state switching devices.

Gates 2106 of the switching devices 2102 are connected with the capacitors 44 and anodes of the diodes 2104 in locations between the capacitors 44 and the diodes 2104. Collectors 2112 of the switching devices 2102 are connected with the gates 2002 of the switching devices 2108 and cathodes of the diodes 2104 in locations between the gates 2002 of the switching devices 2108 and the cathodes of the diodes 2104. Emitters 2110 of the switching devices 2102 are connected with each other, with the capacitors 44, and with the sources 2020 of the switching devices 2018 in locations between the capacitors 44 and the sources 2020 of the switching devices 2018.

The gate drive circuit 2100 operates in the manner described above in connection with the gate drive circuits 1602, 2000 to close the switching devices 2018. The follower switching devices 2102 in the gate drive circuit 2100 can assist in preventing electrical noise or other interference (e.g., electric signals other than voltages or currents conducted from the power source 1504) from re-charging the capacitors 44 subsequent to opening the switching devices 2018. For example, after removing the pulse voltage applied to the transformer 32 to activate the switching device 2018A, the capacitor 44A discharges the stored energy (as described above) to close the switching device 2018A. The loads 1506, 1508, however, may generate electric signals or noise that is conducted back into the switching devices 2018. The signals or noise can be conducted from the switching device 2018A back into the gate drive circuit 2100.

Without the follower switching devices 2102 and/or the diodes 2104 being present, the signals or noise can be conducted back through the switching devices 2018 and into the capacitor 44A. The signals or noise could re-charge the capacitor 44A to an extent that the energy stored in the capacitor 44A (and thereby applied to the gate 2002 of the switching device 2018A) would re-activate the switching device 2018A. As a result, the switching device 2018A would close, and current could be conducted to the load 1506 and/or 1508, without the power source 1504 supplying current to activate the switching device 2018A.

With the follower switching devices 2102, the switching devices 2102 and diodes 2104 prevent the signals or noise from being conducted to and re-charging the capacitor 44A. The signals or noise would be conducted in a loop that includes the source 2020 of the switching device 2018A, the diode 2104A, and the follower switching device 2102. The signals or noise are prevented from reaching the capacitor 44A and, as a result, the capacitor 44A is not re-charged and the switching device 2018A is not inadvertently re-activated.

Figure 22:
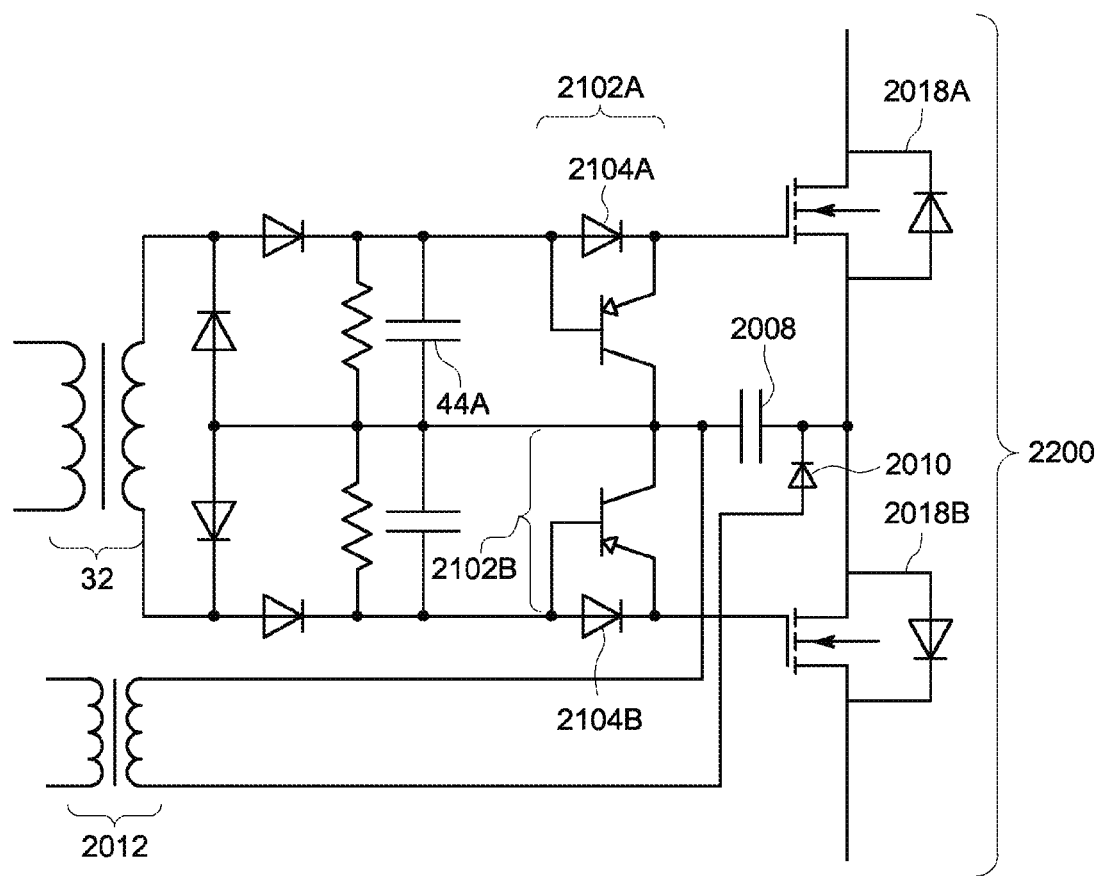
FIG. 22 illustrates another embodiment of a gate drive circuit.

FIG. 22 illustrates another embodiment of a gate drive circuit 2200. The gate drive circuit 2200 may be used in place of one or more of the gate drive circuits 1602, 2000, 2100 described above. For example, the switching system 1502, switching assemblies 1510, and/or switch cells 1518 shown in FIG. 15 may include one or more gate drive circuits 2200 shown in FIG. 22 in place of one or more of the gate drive circuits 1602, 2000, 2100.

The gate drive circuit 2200 includes many of the same components as the gate drive circuits 1602, 2000, 2100. The gate drive circuit 2200 may be formed as a combination of the gate drive circuits 2000, 2100. For example, the gate drive circuit 2200 may include the negative bias capacitor 2008 and the diode 2010 of the gate drive circuit 2000 and the following switching devices 2102 and diodes 2104 of the gate drive circuit 2100. In operation, the switching devices 2018 of the gate drive circuit 2200 may be activated or deactivated as described above. The negative bias capacitor 2008 can store energy via the second transformer 2012. As described above, this stored energy can be applied to the gate of the switching device 2018 as a negative bias to prevent noise or other electric fluctuations in the gate drive circuit 2200 from activating the switching device 2018. Also as described above, the follower switching device 2102A can prevent noise or other electric fluctuations (not provided from the power source 1504) from re-charging the capacitor 44A and thereby re-activating the switching device 2018A, also as described above.

Figure 23:
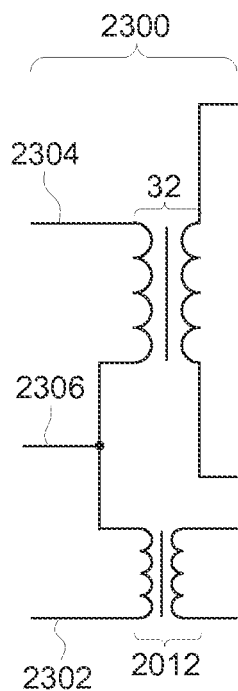
FIG. 23 illustrates one embodiment of an energy transform system.

FIG. 23 illustrates one embodiment of an energy transform system 2300. The system 2300 can be used to transfer electric energy from the power source 1504 (shown in FIG. 15) to the transformers 32, 2012 of the gate drive circuits 2000, 2200 shown in FIGS. 20 and 22. The system 2300 includes three conductive pathways connected with the transformers 32, 2012. The pathways can include pathways 2302, 2304, 2306. The conductive pathways 2302, 2304, 2306 can represent wires, cables, or the like, that are conductively coupled with the power source 1504 or another power source.

The power source conducts voltage pulses (as described above) to the transformers 32, 2012 to control the gate drive circuits 2000, 2200. The power source can conduct the voltage pulse to the transformer 32 via the pathways 2304, 2306 to activate or deactivate the switching devices in the gate drive circuits 2000, 2200. The power source can conduct an alternating pulse or other voltage or current along the pathways 2306, 2302 to charge the bias capacitor 2008, as described above. Using the same pathway 2306 for control of the switching devices and to charge the bias capacitor 2008 can reduce the total length of conductive pathways extending from the power source to the gate drive circuits 2000, 2200. For example, instead of using two separate pathways to connect with the transformer 32 and two other pathways to connect with the transformer 2012, the use of three pathways to connect with both transformers 32, 2012 can reduce the length of pathways and, as a result, the cost and complexity of the system 2300 used to transfer power to the gate drive circuits.

Figure 24:
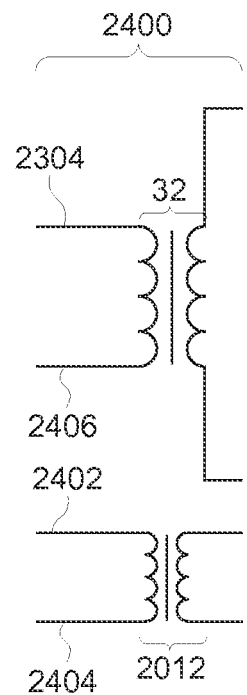
FIG. 24 illustrates another embodiment of an energy transform system.

FIG. 24 illustrates another embodiment of an energy transform system 2400. The system 2400 can be used to transfer electric energy from the power source 1504 (shown in FIG. 15) to the transformers 32, 2012 of the gate drive circuits 2000, 2200 shown in FIGS. 20 and 22. In contrast to the system 2300 shown in FIG. 23, the system 2400 includes four conductive pathways connected with the transformers 32, 2012. The pathways can include the conductive pathway 2304 (also shown in FIG. 23) and the conductive pathways 2402, 2404, 2406. The conductive pathways 2402, 2404, 2406, 2304 can represent wires, cables, or the like, that are conductively coupled with the power source 1504 or another power source. The pathways 2304, 2406 conductively couple the power source 1504 with the transformer 32 and the pathways 2402, 2404 conductively couple the power source 1504 with the transformer 2012 without being conductively coupled with the transformer 32. The separate groups of pathways 2304, 2406 and the pathways 2402, 2404 can assist the power source 1504 in separately controlling the voltages and/or currents supplied to the different transformers 32, 2012.

Figure 25:
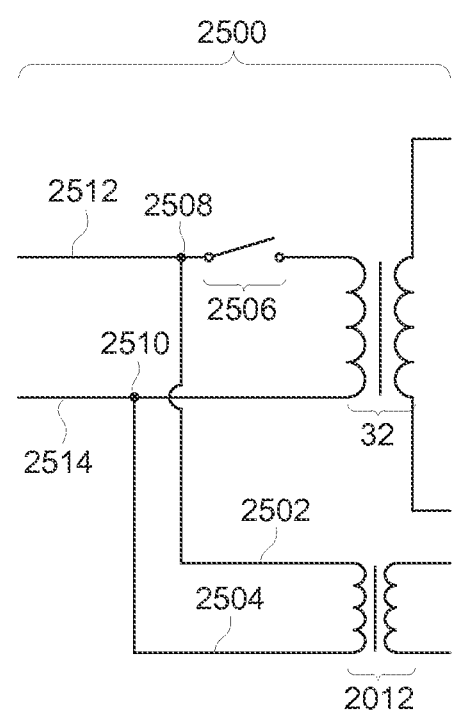
FIG. 25 illustrates another embodiment of an energy transform system.

FIG. 25 illustrates another embodiment of an energy transform system 2500. The system 2500 can be used to transfer electric energy from the power source 1504 (shown in FIG. 15) to the transformers 32, 2012 of the gate drive circuits 2000, 2200 shown in FIGS. 20 and 22. The system 2500 includes conductive pathways 2512, 2514 conductively coupling the power source with the transformer 32 and conductive pathways 2502, 2504 conductively coupled with the pathways 2512, 2514. The conductive pathways 2502, 2504 may be conductively coupled with the pathways 2512, 2514 in locations that are closer to the gate drive circuits than the power source in order to reduce the total length of conductive pathways used in the system 2500 relative to the system 2300. A switching device 2506 is conductively connected with and disposed between a node 2508 that connects the conductive pathway 2512 with the conductive pathway 2502 and the transformer 32. Alternatively, the switching device 2506 may be disposed between a node 2510 that connects the conductive pathway 2514 with the conductive pathway 2504 and the transformer 32. The switching device 2506 can represent a mechanical switch or a solid state switch that opens or closes to control conduction of voltage or current to the transformer 32. The switching device 2506 can be controlled by the controller 1522 shown in FIG. 15.

Figure 26:
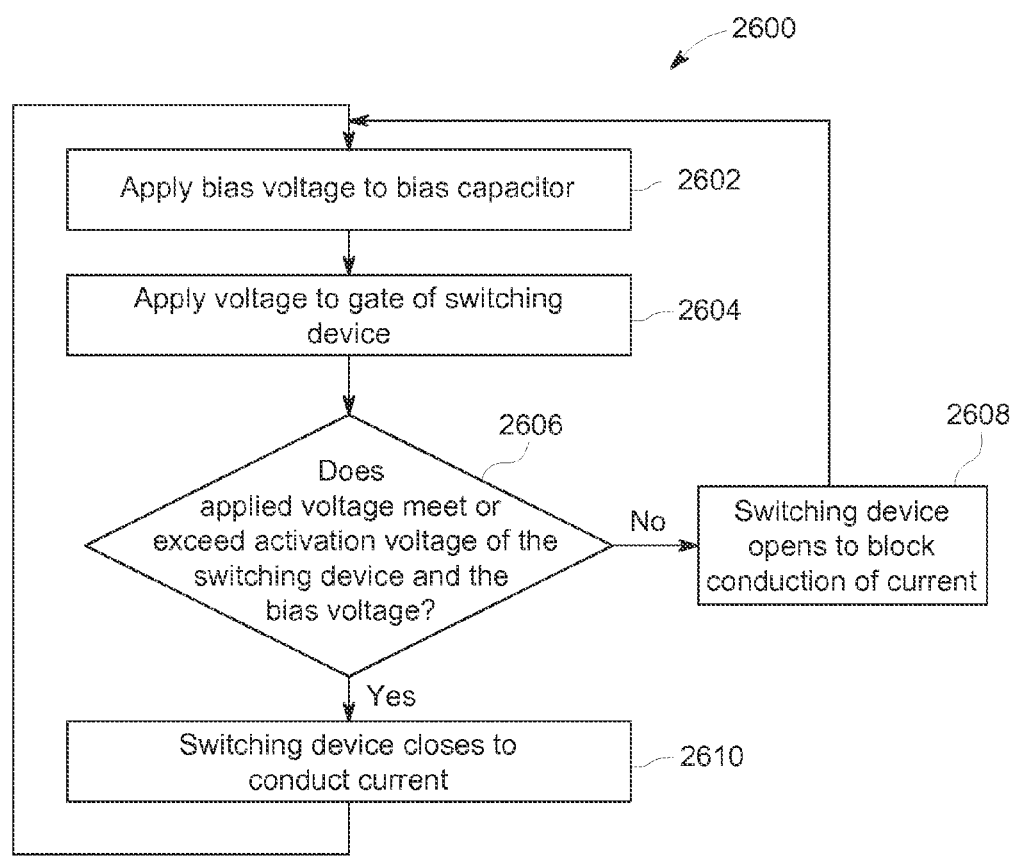
FIG. 26 illustrates a flowchart of one embodiment of a method for operating a gate drive circuit.

FIG. 26 illustrates a flowchart of one embodiment of a method 2600 for operating a gate drive circuit. The method 2600 may be used to control conduction of electric current to two or more different loads, such as by controlling the conduction of different phases of current from a power source to multiple different loads using the gate drive circuit. In one aspect, the method 2600 may be performed by the gate drive circuits described herein that include one or more bias capacitors (e.g., the gate drive circuits 2000, 2200).

At 2602, a bias voltage is applied to a bias capacitor in the gate drive circuit. For example, the power source 1504 (shown in FIG. 15) may transfer electric power to the capacitor 2008 (shown in FIGS. 20 and 22) via the transformer 2012 (shown in FIGS. 20 and 22) and through the diode 2010 (shown in FIG. 20). This bias voltage charges the bias capacitor with electric energy, such as five volts or another value.

At 2604, voltage is applied to a gate of a switching device. The voltage that is applied to the gate may come from different sources. In a situation where the voltage is being applied by the power source 1504 to activate the switching device 2018A (shown in FIG. 20), then the voltage may be applied via the transformer 32 (shown in FIGS. 2, 20, and 22), through the diode 54A (shown in FIGS. 2, 20, and 22), and to the capacitor 44A (shown in FIGS. 2, 20, and 22), which then applies the voltage to the gate 2002 (shown in FIGS. 20 and 22) of the switching device 2018A. In another situation, the voltage may be applied to the gate 2002 from electrical noise in the gate drive circuit (e.g., the voltage is not supplied from the power source 1504 via the transformer 32).

At 2606, if the voltage applied to the gate (from the power source or from elsewhere) of the switching device is as large as or larger than a combination of an activation voltage of the switching device and the bias voltage of the bias capacitor, then the applied voltage may be sufficient to activate (e.g., close) the switching device. The combination of the activation voltage and the bias voltage may be a sum of the absolute value of the bias voltage and the activation voltage. For example, if the bias voltage is −5 volts and the activation voltage is +15 volts, then the voltage applied to the gate would need to be at least +20 volts to activate the switching device. As a result, the voltage applied to the gate is likely not noise in the gate drive circuit, and flow of the method 2600 can proceed toward 2610. On the other hand, if the voltage applied to the gate does not exceed the combination of the activation voltage and the bias voltage, then the applied voltage may be due to noise in the gate drive circuit. As a result, flow of the method 2600 can proceed toward 2608.

At 2608, the switching device remains deactivated (e.g., open) to prevent the electrical noise or other current in the gate drive circuit from being conducted to the loads. Flow of the method 2600 can return toward 2602. Alternatively, operation of the method 2600 may terminate. At 2610, the switching device is activated (e.g., closes) to conduct the current from the power source (or another power source) to a load. For example, the switching device can close to conduct one phase of a multi-phase current supplied from the power source 1504 to one of the loads 1506, 1508 (shown in FIG. 15). Flow of the method 2600 can return toward 2602. Alternatively, operation of the method 2600 may terminate.

Figure 27:
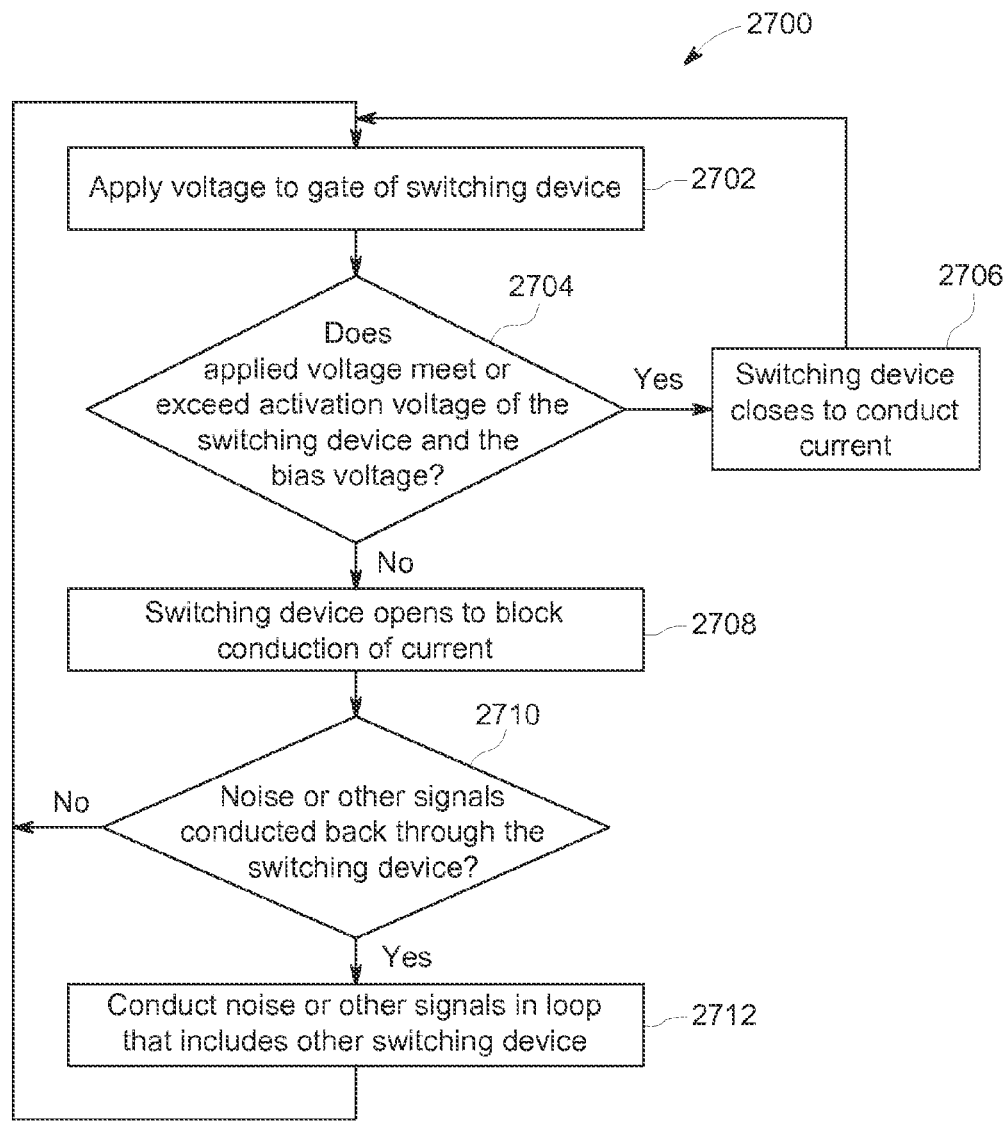
FIG. 27 illustrates a flowchart of one embodiment of a method for operating a gate drive circuit.

FIG. 27 illustrates a flowchart of one embodiment of a method 2700 for operating a gate drive circuit. The method 2700 may be used to control conduction of electric current to two or more different loads, such as by controlling the conduction of different phases of current from a power source to multiple different loads using the gate drive circuit. In one aspect, the method 2700 may be performed by the gate drive circuits described herein that include one or more following switching devices (e.g., the gate drive circuits 2100, 2200). In one embodiment, the methods 2600, 2700 may be performed together. For example, a gate drive circuit having one or more bias capacitors and having one or more following switching devices (e.g., the gate drive circuit 2200) may perform both methods 2600, 2700.

At 2702, voltage is applied to a gate of a switching device. The voltage that is applied to the gate may come from different sources. As described above, the voltage may be applied by the power source to activate the switching device, or the voltage may be applied by noise in the gate drive circuit. At 2704, if the voltage applied to the gate (from the power source or from elsewhere) of the switching device is as large as or larger than a combination of an activation voltage of the switching device and the bias voltage of a bias capacitor, then the applied voltage may be sufficient to activate (e.g., close) the switching device, as described above. As a result, the voltage applied to the gate is likely not noise in the gate drive circuit, and flow of the method 2700 can proceed toward 2706. At 2706, the switching device is activated (e.g., closes) to conduct the current from the power source (or another power source) to a load. For example, the switching device can close to conduct one phase of a multi-phase current supplied from the power source 1504 to one of the loads 1506, 1508 (shown in FIG. 15). Flow of the method 2700 can return toward 2702. Alternatively, operation of the method 2600 may terminate.

On the other hand, if the voltage applied to the gate does not exceed the combination of the activation voltage and the bias voltage, then the applied voltage may be due to noise in the gate drive circuit, or the applied voltage may be decreased by the power source in order to deactivate the switching device. As a result, flow of the method 2700 can proceed toward 2708. At 2708, the switching device remains deactivated (e.g., open) to prevent the electrical noise or other current in the gate drive circuit from being conducted to the loads. Flow of the method 2600 can proceed toward 2710. In another embodiment, there may not be a bias voltage applied to the switching device by a bias capacitor. In such an embodiment, the determination at 2704 may involve determining whether the applied voltage meets or exceeds the activation voltage of the switching device.

At 2710, electric noise or other signals that are not generated by the power source or another source to control activation or deactivation of the switching device may be conducted back into the switching device. For example, electric signals or noise generated by the loads may be conducted into the switching device. If such signals or noise are conducted back into the switching device, flow of the method 2700 may proceed toward 2712. Otherwise, flow of the method 2700 can return toward 2702. Alternatively, operation of the method 2700 may terminate.

At 2712, the noise or other signals are conducted in a loop that includes another switching device and the switching device referred to at 2702. For example, a following switching device may prevent the noise or other signals from being conducted to a capacitor in the gate drive circuit that applies a voltage to the switching device used to control conduction to the loads. The following switching device may keep the noise or other electrical signals conducted in a loop until the noise or signals dissipate. Flow of the method 2700 can return to 2702 or terminate.

Different examples and aspects of the apparatus and methods are disclosed herein that include a variety of components, features, and functionality. It should be understood that the various examples and aspects of the apparatus and methods disclosed herein may include any of the components, features, and functionality of any of the other examples and aspects of the apparatus and methods disclosed herein in any combination, and all of such possibilities are intended to be within the spirit and scope of the present disclosure.

It should be noted that the particular arrangement of components (e.g., the number, types, placement, or the like) of the illustrated embodiments may be modified in various alternate embodiments. In various embodiments, different numbers of a given module, system, or unit may be employed, a different type or types of a given module, system, or unit may be employed, a number of modules, systems, or units (or aspects thereof) may be combined, a given module, system, or unit may be divided into plural modules (or sub-modules), systems (or sub-systems) or units (or sub-units), a given module, system, or unit may be added, or a given module, system or unit may be omitted.

It should be noted that the various embodiments may be implemented in hardware, software or a combination thereof. The various embodiments and/or components, for example, the modules, systems, or components and controllers therein, also may be implemented as part of one or more computers or processors. The computer or processor may include a computing device, an input device, a display unit, and an interface. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid state drive, optical drive, and the like. The storage device may also be other similar means for loading computer programs or other instructions into the computer or processor.

As used herein, the term "computer," "controller," "system," and "module" may each include any processor-based or microprocessor-based system including systems using microcontrollers, reduced instruction set computers (RISC), application specific integrated circuits (ASICs), logic circuits, GPUs, FPGAs, and any other circuit or processor capable of executing the functions described herein. The above examples are exemplary only, and are thus not intended to limit in any way the definition and/or meaning of the term "module," "system," or "computer."

The computer, module, system, or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer, module, system, or processor as a processing machine to perform specific operations such as the methods and processes of the various embodiments described and/or illustrated herein. The set of instructions may be in the form of a software program. The software may be in various forms such as system software or application software and which may be embodied as a tangible and non-transitory computer readable medium. Further, the software may be in the form of a collection of separate programs, systems, or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program. The individual components of the various embodiments may be virtualized and hosted by a cloud type computational environment, for example to allow for dynamic allocation of computational power, without requiring the user concerning the location, configuration, and/or specific hardware of the computer system.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from the scope thereof. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, paragraph (f), unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A power system comprising:
a switching system configured to be operably coupled with a power source that supplies electric current to plural subterranean pumps for pumping a resource from beneath a surface of earth, the switching system comprising switching assemblies configured to control conduction of the current from the power source to the pumps, wherein the switching assemblies include switch cells that comprise a solid state first switching device, a first capacitor, and a bias capacitor, the first switching device is configured to activate and be responsive to receiving a voltage from that is at least as large as an activation voltage of the first switching device to conduct electric current between a first transformer and an electric load, the first switching device configured to deactivate and to stop conduction of the electric current between the first transformer and the electric load, the first capacitor is conductively coupled with the first switching device and the first transformer between the first switching device and the first transformer, the first capacitor configured to store electric energy received from the first transformer to activate the first switching device, the bias capacitor is conductively coupled with the first switching device between the first capacitor and the first switching device, the bias capacitor configured to be conductively coupled with a second transformer to receive a bias voltage via the second transformer, wherein the bias capacitor is configured to apply the bias voltage to the first switching device to prevent the first switching device from activating and conducting the current from the power source to one or more of the pumps unless a combination of the voltage received by the first switching device via the first transformer and the bias voltage is at least as large as the activation voltage of the first switching device.

2. The power system of claim 1, wherein the switch cells also include a solid state following switching device and a diode, the solid state following switching device conductively coupled with the first switching device and the first capacitor in a location between the first switching device and the first capacitor, the diode conductively coupled with the following switching device and the first switching device in a location between the first capacitor and the first switching device, wherein the following switching device and the diode are configured to conduct electric noise received via the first switching device in a conductive loop that excludes the first capacitor.

3. The power system of claim 1, wherein the switch cells also include a diode configured to be coupled in series with the bias capacitor between the second transformer and the bias capacitor with a cathode of the diode coupled with the bias capacitor and an anode of the diode configured to be coupled with the second transformer.

4. The power system of claim 3, wherein the diode is configured to restrict conduction of current received from the second transformer to the bias capacitor such that the bias voltage is a negative voltage.

5. The power system of claim 1, wherein the switch cells also include a solid state second switching device and a second capacitor, the second switching device configured to activate and be responsive to receiving the voltage that is at least as large as an activation voltage of the second switching device to conduct electric current between the first transformer and the electric load, the second switching device configured to deactivate and to stop conduction of the electric current between the first transformer and the electric load, the second capacitor conductively coupled with the second switching device and the first transformer between the second switching device and the second transformer, the second capacitor also configured to store the electric energy received from the first transformer to activate the second switching device, wherein the bias capacitor is configured to apply the bias voltage to the second switching device to prevent the second switching device from activating unless the combination of the voltage received by the second switching device via the first transformer and the bias voltage is at least as large as the activation voltage of the second switching device.

6. The power system of claim 5, wherein the first switching device is configured to activate and be responsive to the first transformer receiving a positive voltage pulse from the power source without the second switching device being activated, and the second switching device is configured to activate and be responsive to the first transformer receiving a negative voltage pulse from the power source without the first switching device being activated.

7. The power system of claim 5, wherein the switch cells also include a first diode, a second diode, a third diode, and a fourth diode, the first diode having a cathode operably connected with the first switching device and having an anode configured to be operably connected with the first transformer in a location between the first capacitor and the first transformer, the second diode having a cathode operably connected with the second switching device and having an anode configured to be operably connected with the first transformer in a location between the second capacitor and the first transformer, the third diode having a cathode operably connected with the anode of the first diode and a cathode operably connected with the first capacitor, and the fourth diode having a cathode operably connected with the anode of the second diode and a cathode operably connected with the second capacitor, wherein the anodes of the third and fourth diodes are operably connected with each other in a location between the first and second capacitors.

8. The power system of claim 1, further comprising the first and second transformers, wherein the first transformer is conductively coupled with the first switching device and the first capacitor by first and second conductive pathways, and wherein the second transformer is conductively coupled with the bias capacitor by the second conductive pathway and a third conductive pathway.

9. A power system comprising:
a switching system configured to be operably coupled with a power source that supplies electric current to plural subterranean pumps for pumping a resource from beneath a surface of earth, the switching system comprising switching assemblies configured to control conduction of the current from the power source to the pumps, wherein the switching assemblies include switch cells that comprise a solid state first switching device, a first capacitor, a solid state following switching device, and a first diode, the solid state first switching device is configured to activate and be responsive to receiving a voltage that is at least as large as an activation voltage of the first switching device to conduct electric current between a first transformer and an electric load, the first switching device configured to deactivate and to stop conduction of the electric current between the first transformer and the electric load, the first capacitor is conductively coupled with the first switching device and the first transformer between the first switching device and the first transformer, the first capacitor configured to store electric energy received from the first transformer to activate the first switching device, the solid state following switching device is conductively coupled with the first switching device and the first capacitor in a location between the first switching device and the first capacitor, the first diode is conductively coupled with the following switching device and the first switching device in a location between the first capacitor and the first switching device, wherein the following switching device and the first diode are configured to conduct electric noise received via the first switching device in a conductive loop that excludes the first capacitor.

10. The power system of claim 9, wherein the switching assemblies also include a second diode configured to be coupled in series with the bias capacitor between the second transformer and the bias capacitor with a cathode of the second diode coupled with the bias capacitor and an anode of the second diode configured to be coupled with the second transformer.

11. The power system of claim 10, wherein the second diode is configured to restrict conduction of current received from the second transformer to the bias capacitor such that the bias voltage is a negative voltage.

12. The power system of claim 9, wherein the switching assemblies also include a bias capacitor conductively coupled with the first switching device between the first capacitor and the first switching device, the bias capacitor configured to be conductively coupled with a second transformer to receive a bias voltage via the second transformer,
wherein the bias capacitor is configured to apply the bias voltage to the first switching device to prevent the first switching device from activating unless a combination of the voltage received by the first switching device via the first transformer and the bias voltage is at least as large as the activation voltage of the first switching device.

13. The power system of claim 12, wherein the switching assemblies also include a solid state second switching device and a second capacitor, the second switching device is configured to activate and be responsive to receiving the voltage that is at least as large as an activation voltage of the second switching device to conduct electric current between the first transformer and the electric load, the second switching device configured to deactivate and to stop conduction of the electric current between the first transformer and the electric load, the second capacitor is conductively coupled with the second switching device and the first transformer between the second switching device and the second transformer, the second capacitor configured to store the electric energy received from the first transformer to activate the second switching device,
wherein the bias capacitor is configured to apply the bias voltage to the second switching device to prevent the second switching device from activating unless the combination of the voltage received by the second switching device via the first transformer and the bias voltage is at least as large as the activation voltage of the second switching device.

14. The power system of claim 13, wherein the first switching device is configured to activate and be responsive to the first transformer receiving a positive voltage pulse from the power source without the second switching device being activated, and the second switching device is configured to activate and be responsive to the first transformer receiving a negative voltage pulse from the power source without the first switching device being activated.

15. The power system of claim 9, wherein the switching assemblies also include a second diode, a third diode, a fourth diode, and a fifth diode, the second diode having a cathode operably connected with the first switching device and having an anode configured to be operably connected with the first transformer in a location between the first capacitor and the first transformer, the third diode having a cathode operably connected with the second switching device and having an anode configured to be operably connected with the first transformer in a location between the second capacitor and the first transformer, the fourth diode having a cathode operably connected with the anode of the second diode and a cathode operably connected with the first capacitor, the fifth diode having a cathode operably connected with the anode of the third diode and a cathode operably connected with the second capacitor,
wherein the anodes of the fourth and fifth diodes are operably connected with each other in a location between the first and second capacitors.

16. A power system comprising:
a switching system configured to be operably coupled with a power source that supplies electric current to plural subterranean pumps for pumping a resource from beneath a surface of earth, the switching system comprising switching assemblies configured to control conduction of the current from the power source to the pumps, wherein the switching assemblies include switch cells that comprise a solid state first switching device, a first capacitor, a bias capacitor, a solid state following switching device, and a first diode, the first switching device is configured to activate and be responsive to receiving a voltage that is at least as large as an activation voltage of the first switching device to conduct electric current between a first transformer and an electric load, the first switching device configured to deactivate and to stop conduction of the electric current between the first transformer and the electric load, the first capacitor is conductively coupled with the first switching device and the first transformer between the first switching device and the first transformer, the first capacitor configured to store electric energy received from the first transformer to activate the first switching device, the bias capacitor is conductively coupled with the first switching device between the first capacitor and the first switching device, the bias capacitor configured to be conductively coupled with a second transformer to receive a bias voltage via the second transformer, wherein the bias capacitor is configured to apply the bias voltage to the first switching device to prevent the first switching device from activating unless a combination of the voltage received by the first switching device via the first transformer and the bias voltage is at least as large as the activation voltage of the first switching device, the following switching device is conductively coupled with the first switching device and the first capacitor in a location between the first switching device and the first capacitor, the first diode is conductively coupled with the following switching device and the first switching device in a location between the first capacitor and the first switching device, wherein the following switching device and the first diode are configured to conduct electric noise received via the first switching device in a conductive loop that excludes the first capacitor.

17. The power system of claim 16, wherein the switching assemblies also include a second diode configured to be coupled in series with the bias capacitor between the second transformer and the bias capacitor with a cathode of the second diode coupled with the bias capacitor and an anode of the second diode configured to be coupled with the second transformer, wherein the second diode is configured to restrict conduction of current received from the second transformer to the bias capacitor such that the bias voltage is a negative voltage.

18. The power system of claim 16, wherein the switching assemblies also include a solid state second switching device and a second capacitor, the second switching device is configured to activate responsive to receiving the voltage that is at least as large as an activation voltage of the second switching device to conduct electric current between the first transformer and the electric load, the second switching device configured to deactivate to stop conduction of the electric current between the first transformer and the electric load, the second capacitor is conductively coupled with the second switching device and the first transformer between the second switching device and the second transformer, the second capacitor configured to store the electric energy received from the first transformer to activate the second switching device, wherein the bias capacitor is configured to apply the bias voltage to the second switching device to prevent the second switching device from activating unless the combination of the voltage received by the second switching device via the first transformer and the bias voltage is at least as large as the activation voltage of the second switching device.

19. The power system of claim 18, wherein the first switching device is configured to activate and be responsive to the first transformer receiving a positive voltage pulse from the power source without the second switching device being activated, and the second switching device is configured to activate and be responsive to the first transformer receiving a negative voltage pulse from the power source without the first switching device being activated.

20. The power system of claim 18, wherein the switching assemblies also include a second diode, a third diode, a fourth diode, and a fifth diode, the second diode having a cathode operably connected with the first switching device and having an anode configured to be operably connected with the first transformer in a location between the first capacitor and the first transformer, the third diode having a cathode operably connected with the second switching device and having an anode configured to be operably connected with the first transformer in a location between the second capacitor and the first transformer, the fourth diode having a cathode operably connected with the anode of the second diode and a cathode operably connected with the first capacitor, the fifth diode having a cathode operably connected with the anode of the third diode and a cathode operably connected with the second capacitor, wherein the anodes of the fourth and fifth diodes are operably connected with each other in a location between the first and second capacitors.

* * * * *